(12) United States Patent
Kornilovich et al.

(10) Patent No.: US 7,407,738 B2
(45) Date of Patent: Aug. 5, 2008

(54) FABRICATION AND USE OF SUPERLATTICE

(76) Inventors: Pavel Kornilovich, 2876 NW. Audene Dr., Corvallis, OR (US) 97330; Peter Mardilovich, 4327 NW. Silverbelle Pl., Corvallis, OR (US) 97330; James Stasiak, 29704 Bartels Creek Dr., Lebanon, OR (US) 97355; Niranjan Thirukkovalur, 2265 SW. Michelle Dr., Corvallis, OR (US) 97330

( * ) Notice: Subject to any disclaimer, the term of this patent is extended or adjusted under 35 U.S.C. 154(b) by 602 days.

(21) Appl. No.: 10/817,729

(22) Filed: Apr. 2, 2004

(65) Prior Publication Data

US 2005/0221235 A1    Oct. 6, 2005

(51) Int. Cl.
    *G03F 7/00*    (2006.01)
(52) U.S. Cl. .................. 430/322; 430/324; 430/330; 430/296; 430/320; 430/314
(58) Field of Classification Search .......... 430/322, 430/320, 324, 296, 330, 311, 313, 314
    See application file for complete search history.

(56) References Cited

U.S. PATENT DOCUMENTS

| | | | |
|---|---|---|---|
| 2,744,970 A | 5/1956 | Shockley | |
| 2,939,057 A | 5/1960 | Tezner | |
| 3,964,296 A | 6/1976 | Matzuk | |
| 4,701,366 A | 10/1987 | Deckman | |
| 5,008,616 A | 4/1991 | Lauks et al. | |
| 5,118,801 A | 6/1992 | Lizardi et al. | |
| 5,132,278 A | 7/1992 | Stevens et al. | |
| 5,202,290 A | 4/1993 | Moskovits | |
| 5,237,523 A | 8/1993 | Bonne et al. | |
| 5,330,612 A | 7/1994 | Watanabe | |
| 5,376,755 A | 12/1994 | Negm et al. | |
| 5,418,558 A | 5/1995 | Hock et al. | |
| 5,493,167 A | 2/1996 | Mikol et al. | |
| 5,591,896 A | 1/1997 | Lin | |
| 5,622,825 A | 4/1997 | Law et al. | |
| 5,747,180 A * | 5/1998 | Miller et al. ............... | 428/601 |
| 5,767,521 A | 6/1998 | Takeno et al. | |
| 5,772,905 A | 6/1998 | Chou | |
| 5,780,710 A | 7/1998 | Murase et al. | |
| 5,801,124 A | 9/1998 | Gambl et al. | |
| 5,837,454 A | 11/1998 | Cozzette et al. | |
| 5,837,466 A | 11/1998 | Lane et al. | |

(Continued)

FOREIGN PATENT DOCUMENTS

EP    1 547 970    6/2005

(Continued)

OTHER PUBLICATIONS

U.S. Appl. No. 11/460,598.*

(Continued)

*Primary Examiner*—Mark F. Huff
*Assistant Examiner*—Caleen O Sullivan

(57) ABSTRACT

This disclosure relates to a system and method for fabricating and using a superlattice. A superlattice can be fabricated by applying alternating material layers on a ridge and then removing some of the alternating layers to expose edges. These exposed edges can be of nearly arbitrary length and curvature. These edges can be used to fabricate an array of nano-scale-width curved wires.

49 Claims, 22 Drawing Sheets

U.S. PATENT DOCUMENTS

| | | | |
|---|---|---|---|
| 5,843,653 A | 12/1998 | Gold et al. | |
| 5,869,244 A | 2/1999 | Martin et al. | |
| 5,918,110 A | 6/1999 | Abraham-Fuchs et al. | |
| 5,972,710 A | 10/1999 | Weigl et al. | |
| 5,997,958 A | 12/1999 | Sato et al. | |
| 6,022,669 A * | 2/2000 | Uchida et al. | 430/313 |
| 6,022,749 A * | 2/2000 | Davis et al. | 438/14 |
| 6,034,389 A | 3/2000 | Burns, Jr. et al. | |
| 6,085,413 A | 7/2000 | Klassen et al. | |
| 6,120,844 A | 9/2000 | Chen et al. | |
| 6,150,097 A | 11/2000 | Tyagi et al. | |
| 6,150,106 A | 11/2000 | Martin et al. | |
| 6,231,744 B1 | 5/2001 | Ying et al. | |
| 6,238,085 B1 | 5/2001 | Higashi et al. | |
| 6,256,767 B1 | 7/2001 | Kuekes et al. | |
| 6,265,306 B1 * | 7/2001 | Starnes et al. | 438/632 |
| 6,284,979 B1 | 9/2001 | Malozemoff et al. | |
| 6,294,450 B1 | 9/2001 | Chen et al. | |
| 6,331,680 B1 | 12/2001 | Klassen et al. | |
| 6,355,436 B1 | 3/2002 | Martin et al. | |
| 6,359,288 B1 | 3/2002 | Ying et al. | |
| 6,360,582 B1 | 3/2002 | Chelvayohan et al. | |
| 6,365,059 B1 * | 4/2002 | Pechenik | 216/52 |
| 6,407,443 B2 * | 6/2002 | Chen et al. | 257/616 |
| 6,438,501 B1 | 8/2002 | Szecsody et al. | |
| 6,463,124 B1 | 10/2002 | Weisman | |
| 6,482,639 B2 | 11/2002 | Snow et al. | |
| 6,521,109 B1 | 2/2003 | Bartic et al. | |
| 6,562,577 B2 | 5/2003 | Martin et al. | |
| 6,643,491 B2 | 11/2003 | Kinouchi et al. | |
| 6,656,275 B2 | 12/2003 | Iwamoto | |
| 6,664,031 B2 * | 12/2003 | Jung et al. | 430/325 |
| 6,680,377 B1 | 1/2004 | Stanton et al. | |
| 6,694,800 B2 | 2/2004 | Weckstrom et al. | |
| 6,747,180 B2 | 6/2004 | Ostgard et al. | |
| 2001/0046674 A1 | 11/2001 | Ellington | |
| 2002/0012937 A1 | 1/2002 | Tender et al. | |
| 2002/0061536 A1 | 5/2002 | Martin et al. | |
| 2002/0117659 A1 | 8/2002 | Lieber et al. | |
| 2002/0130353 A1 | 9/2002 | Lieber et al. | |
| 2002/0175408 A1 | 11/2002 | Majumdar et al. | |
| 2003/0089899 A1 | 5/2003 | Lieber et al. | |
| 2003/0121791 A1 | 7/2003 | Cohen | |
| 2003/0132461 A1 | 7/2003 | Roesner et al. | |
| 2003/0148562 A1 | 8/2003 | Luyken et al. | |
| 2003/0162190 A1 | 8/2003 | Gorenstein et al. | |
| 2003/0170650 A1 | 9/2003 | Karube et al. | |
| 2003/0183008 A1 | 10/2003 | Bang et al. | |
| 2003/0186522 A1 | 10/2003 | Duan et al. | |
| 2003/0189202 A1 | 10/2003 | Li et al. | |
| 2003/0219801 A1 | 11/2003 | Lipshutz | |
| 2003/0224435 A1 | 12/2003 | Seiwert | |
| 2004/0005723 A1 | 1/2004 | Empedocles et al. | |
| 2004/0005923 A1 | 1/2004 | Allard et al. | |
| 2004/0007740 A1 | 1/2004 | Abstreiter et al. | |
| 2004/0009510 A1 | 1/2004 | Selwert et al. | |
| 2004/0028936 A1 | 2/2004 | Kogiso et al. | |
| 2004/0031975 A1 | 2/2004 | Kern et al. | |
| 2004/0043527 A1 | 3/2004 | Bradley et al. | |
| 2004/0061234 A1 | 4/2004 | Shah et al. | |
| 2004/0134772 A1 | 7/2004 | Cohen et al. | |
| 2006/0003267 A1 * | 1/2006 | Ramamoorthi et al. | 430/322 |
| 2007/0020773 A1 * | 1/2007 | Kornilovich et al. | 438/2 |
| 2007/0069194 A1 * | 3/2007 | Kornilovich et al. | 257/14 |

FOREIGN PATENT DOCUMENTS

WO  WO 2005/038093  4/2005

OTHER PUBLICATIONS

Melosh et al., "Ultrahigh-Density Nanowire Lattices and Circuits," California Nanosystems Institute, University of California, Scienceexpress Report, Scienceexpress/www.scienceexpress.org/13 March 2003/10.1126/science.1081940, pp. 1-4.*

Covington, et al., "A polymer gate FET sensor array for detecting organic vapours," Sensors and Actuators B 77 Elsevier Science 2001, pp. 155-162.

Melosh, et al.; Ultrahigh-Density Nanowire Lattices and Circuits, California Nanosystems Institute, University of California, Sciencexpress Report, Sciencexpress/www.sciencexpress.org/ 13March2003/10.1126/science.1081940, pp. 1-4.

Coleman, et al; Percolation-dominated conductivity in a conjugated-polymer-carbon-nanotube composite,: Rapid Communications, Physical Review B, vol. 58, No. 12, Sep. 15, 1998, coyright The American Physical Society, 4 pages.

Choi, et al; "Sublighographic nanofabrication technology for nanocatalysts and DNA Chips"; J. Vac. Sci. Technol. B 21(6), Nov./Dec. 2003; pp. 2951-2955.

* cited by examiner

Fig. 10
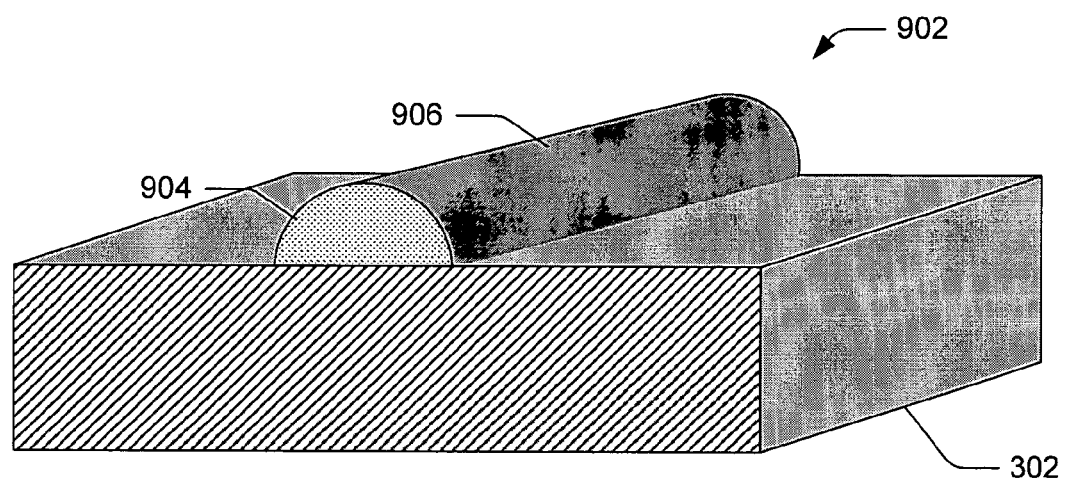
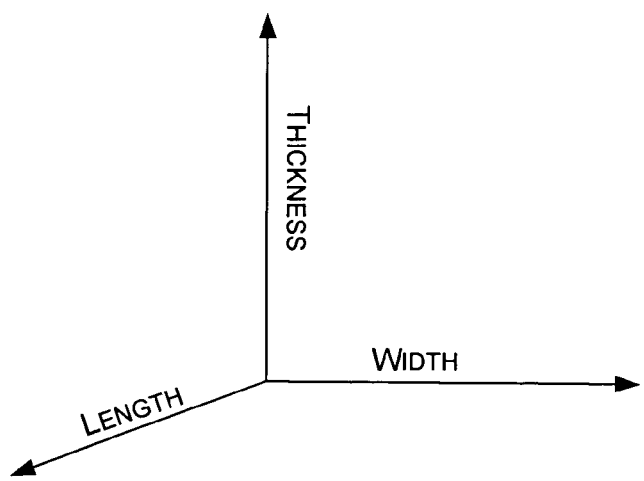

FABRICATION AND USE OF SUPERLATTICE

TECHNICAL FIELD

This invention relates to fabricating and using a superlattice.

BACKGROUND

Thin-wire arrays are used in a large number of devices, and have been found particularly suited for use in small or densely structured computer devices, such as sensors, memory devices, and logic chips.

To address this need for thin-wire arrays, arrays of thin-wires have been created using photolithography. As computer devices get smaller and smaller, however, the wires of these arrays need to be thinner and more closely spaced. Photolithography has so far not proven to be an adequate method to create very thin and closely spaced arrays of wires.

To address this need for thinner-wire arrays, two ways of creating them have been used. One of these ways uses an etched, linear-layered superlattice as a mold for imprint lithography. The other uses an etched, linear-layered superlattice and physical vapor deposition to fabricate arrays of thin, linear wires.

An example of etched, linear-layered superlattice imprint lithography is described in U.S. Pat. No. 6,407,443. This example of imprint lithography includes subsequent lift-off processing that may ultimately limit its process capability. It also uses a nano-imprinting step, which has so far not been consistently and successfully used in a production atmosphere.

Current physical vapor deposition uses an atomic beam to directly deposit material on a surface of an etched, linear-layered superlattice. This deposited material is then physically transferred to a substrate. This method, however, often produces wires having an odd cross-section, which can create various structural and usage difficulties. Current physical vapor deposition also can require processing in an Ultra-High Vacuum ("UHV"), which can be costly to use and could restrict the usage of materials that are incompatible with UHV processing.

Both of these current superlattices have linear layers of materials and are used to create arrays of thin wires that are linear. This further limits the usefulness of the arrays created with these current superlattices, as many small or densely structured computer devices are better suited with arrays of wires that are not linear.

There is, therefore, a need for a technique for manufacturing arrays of thinner wires that allows for non-linear wires and/or is reliable, less expensive, more reproducible, and more production-friendly than permitted by present-day techniques.

BRIEF DESCRIPTION OF THE DRAWINGS

FIG. 10 illustrates a three-dimensional view of an exemplary substrate and ridge having sidewalls and a top.

The same numbers are used throughout the disclosure and figures to reference like components and features.

DETAILED DESCRIPTION

The following disclosure describes various ways of manufacturing and using a superlattice. The systems and methods disclosed enable forming a superlattice having layers with exposed edges of a near-arbitrary length and curvature. These edges can be used to fabricate arrays of curved and non-linear wires with a width and spacing in a nano, micro, and meso scale and in combinations of these scales. The described systems and methods also allow for a superlattice having edges and a corresponding array of wires that are very narrow and tightly spaced but that are also very long.

The disclosed systems and methods offer substantial benefits over many prior-art solutions. These benefits can include precise control of the dimensions of layers in a superlattice and an array or wires, such as a length, width, spacing, and curve or pattern of layers and wires, as well as a number of layers and wires. With the disclosed systems and methods, arrays of nearly arbitrarily patterned nano-width wires can be created, potentially allowing devices using them to function better, more quickly, and be built on a smaller scale.

Prior to setting forth various methods for forming and using a superlattice, a system capable of implementing acts followed in these methods is described.

Exemplary Platform

Figure 1:
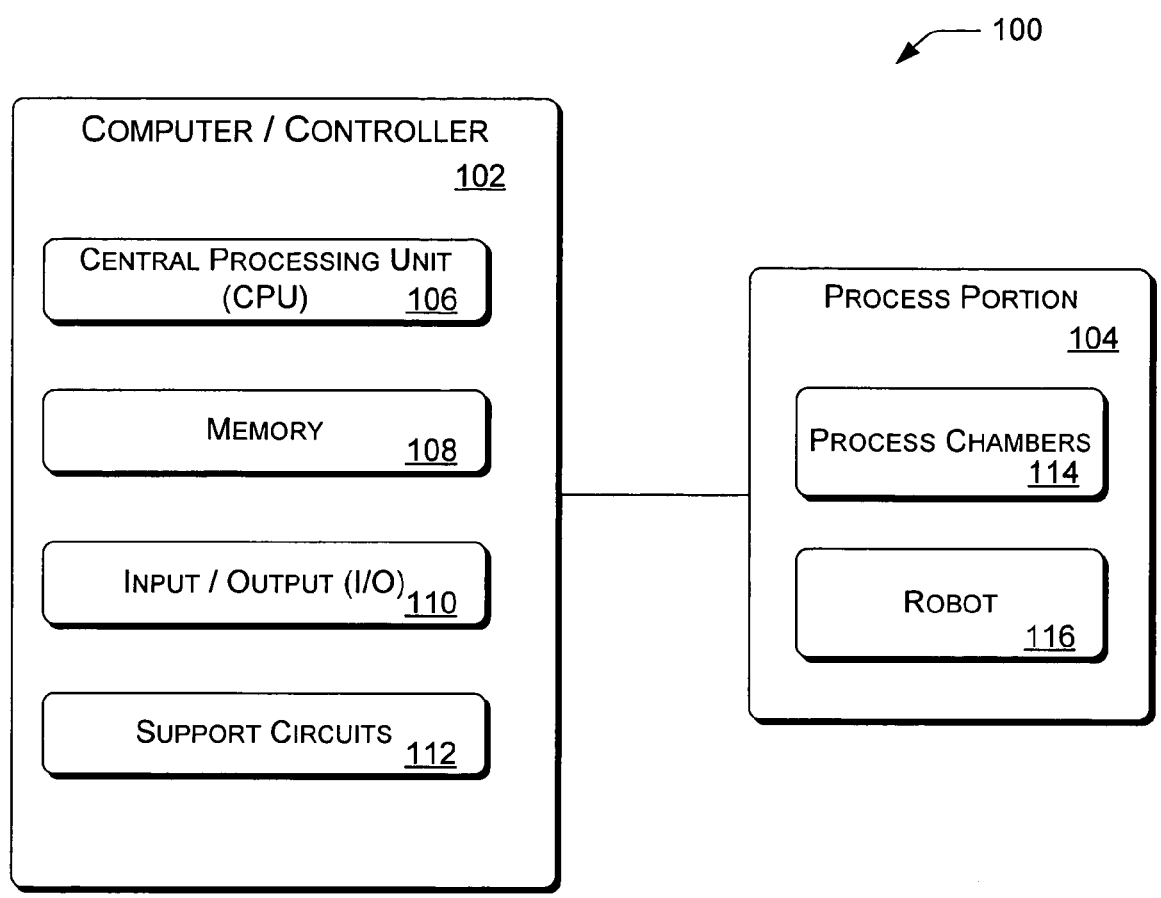
FIG. 1 shows a block diagram of an exemplary system that is capable of implementing methods for forming and using a superlattice.

FIG. 1 illustrates one embodiment of a platform 100 usable to perform methods set forth below for forming and using a superlattice. The platform 100 includes a computer/controller 102 and a process portion 104.

The computer/controller 102 includes a central processing unit (CPU) 106, a memory 108, input/output (I/O) circuits 110, and support circuits 112. The CPU 106 is a general purpose computer which, when programmed by executing software contained in memory 108 (not shown), becomes a directed-purpose computer for controlling the hardware components of the processing portion 104. The memory 108 may include read-only memory, random-access memory, removable storage, a hard disk drive, or any form of digital memory device. The I/O circuits 110 comprise well-known displays for the output of information and a keyboard, mouse, track ball, or other input device that can enable programming of the computer/controller 102. The displays can enable a user to determine the processes performed by the process portion 104 (including the associated robot action included in the process portion 104). The support circuits 112 are well known in the art and include circuits such as cache, clocks, power supplies, and the like.

The memory 108 contains control software that, when executed by the CPU 106, enables the computer/controller 102 to digitally control the various components of the process portion 104. A detailed description of the process that is implemented by the control software is described with respect to FIGS. 2 and 12.

In another embodiment, the computer/controller 102 can be analog. For instance, application-specific integrated circuits capable of controlling processes such as those that are performed by the process portion 104 can be used.

The process portion 104 may include a variety of process chambers 114 between which various substrates and/or a superlattice can be translated, often using a robot mechanism 116. The particulars of the processing varies with different methods described below.

Exemplary Method for Forming Ridges

Figure 2:
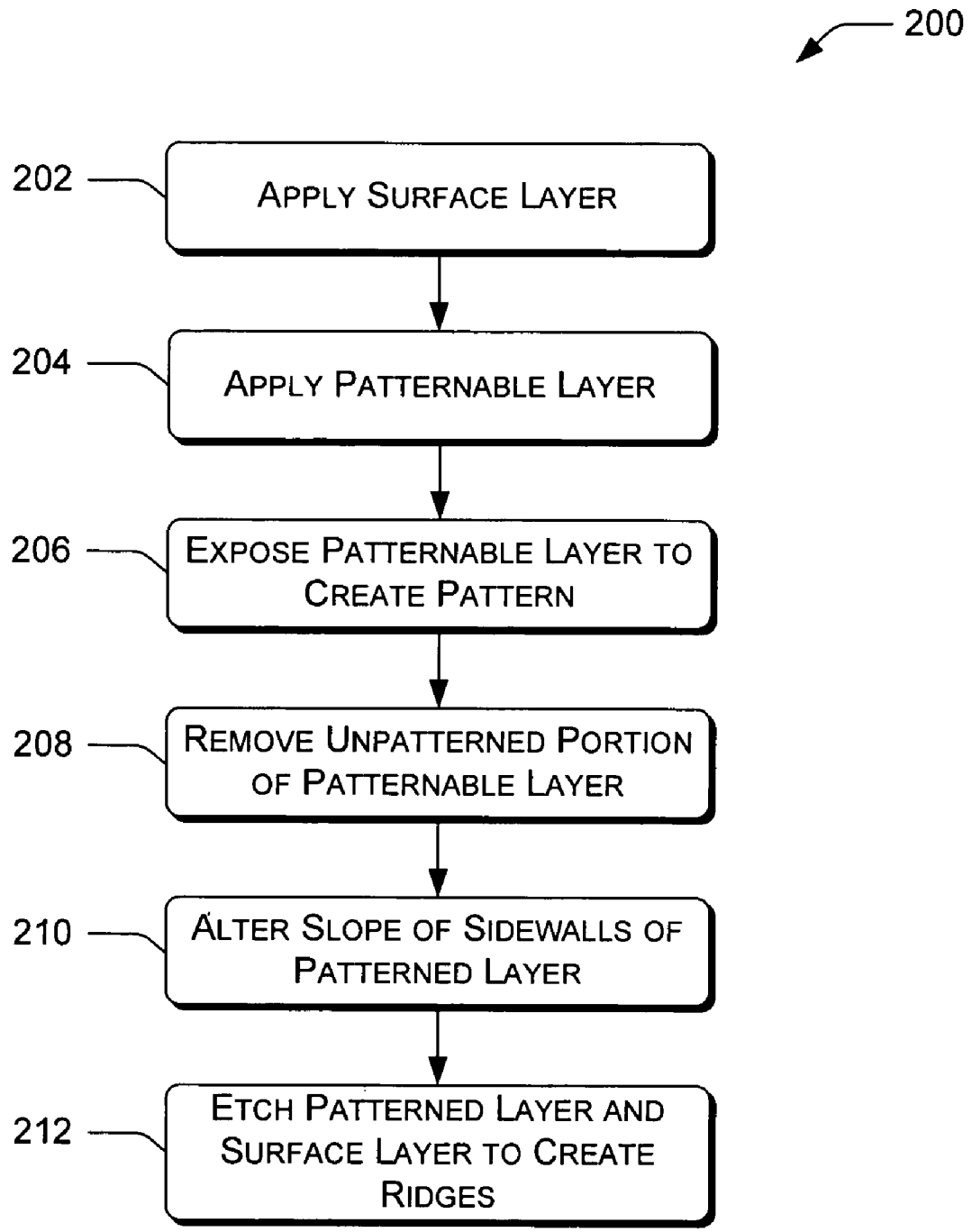
FIG. 2 is a flow diagram of an exemplary method for forming one or more ridges on a substrate.

FIG. 2 shows a flow diagram 200 for an exemplary method for forming one or more ridges on a substrate. These ridges and substrate can be used to aid in creating a superlattice, described in greater detail below. This and the following diagrams are illustrated as a series of blocks representing operations or acts performed by the platform 100. The methods shown through these diagrams may be implemented, however, by any suitable robotics, persons, hardware, software, firmware, or combination thereof. In the case of software and firmware, they represent sets of operations implemented as computer-executable instructions stored in memory and executable by one or more processors.

At block 202 the platform 100 applies a surface layer on a substrate. This surface layer can be shaped into ridges that can be used to aid in forming a superlattice. The platform 100 can apply various different materials as a surface layer, and to varying thicknesses.

Figure 3:
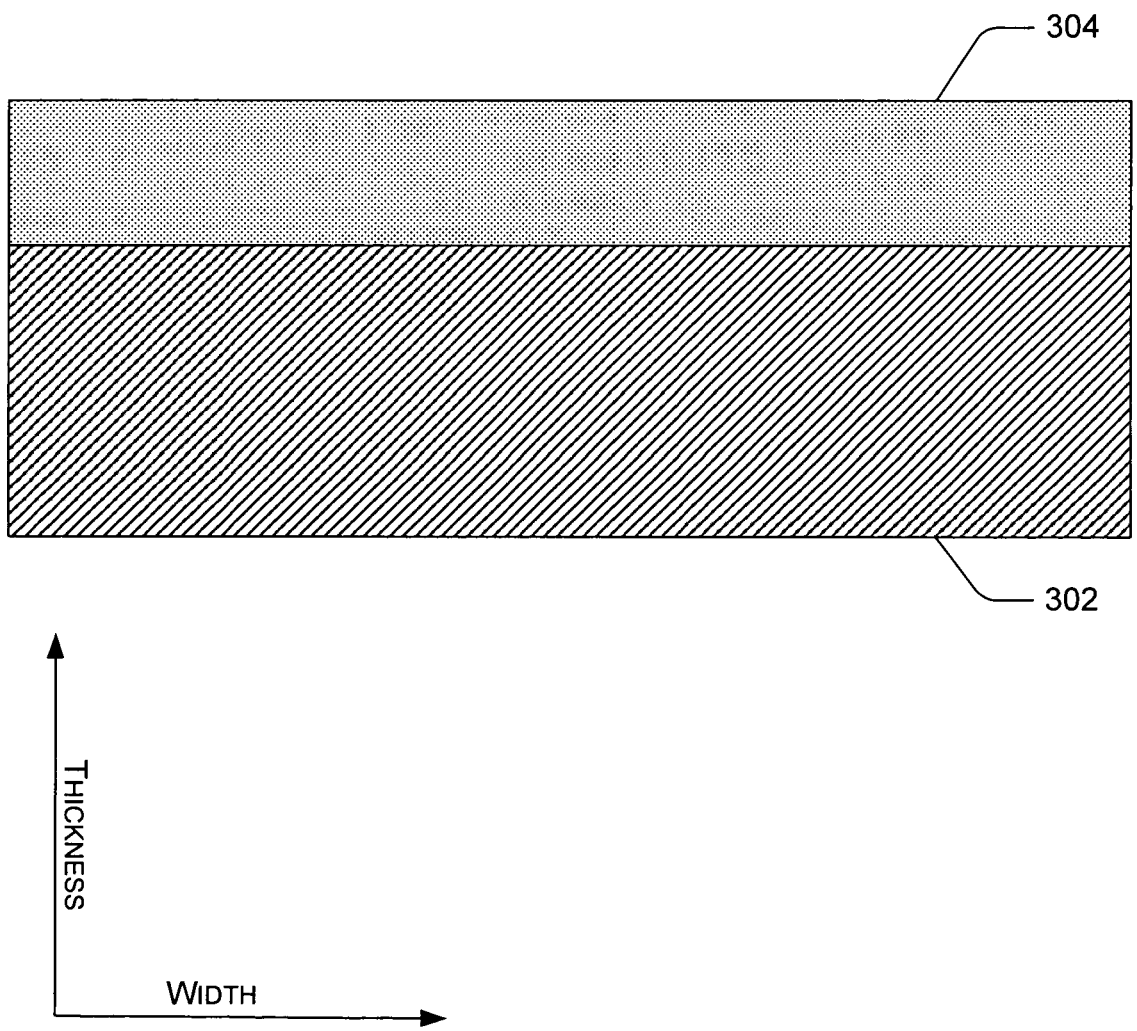
FIG. 3 illustrates a cross-sectional view of an exemplary substrate and surface layer and thickness and width dimensions.

FIG. 3 sets forth a cross-sectional view of an example of a substrate 302 and a surface layer 304. The substrate 302 can be small, as little as nano-meter in scale, to quite large, including many centimeters across. The cross-section of the substrate 302 shows a width and thickness dimensions of the substrate 302 and the surface layer 304.

In one implementation, the surface layer 304 is etchable. In another implementation it is malleable. The surface layer 304 can comprise, for example, an oxide, such as a Plasma Enhanced Chemical Vapor Deposition (PECVD) oxide, a nitride, TetraEthylOrthoSilicate (TEOS), or a low-stress TEOS. When chosen with an appropriate etch rate, the surface layer 304 can be etched to create ridges of various shapes, discussed below.

In another implementation of block 202, the platform 100 applies the surface layer 304 to a thickness of about 0.5 to five microns. The thickness of the surface layer 304 can affect how ridges are formed from the surface layer 304, discussed below. In an implementation where the thickness of the surface layer 304 is shallow, all of the surface layer 304 can be removed except for the ridges.

At block 204 the platform 100 applies a layer on the surface layer 304 of the substrate 302. This layer can be patterned to aid in forming ridges following that pattern, discussed below.

Figure 4:
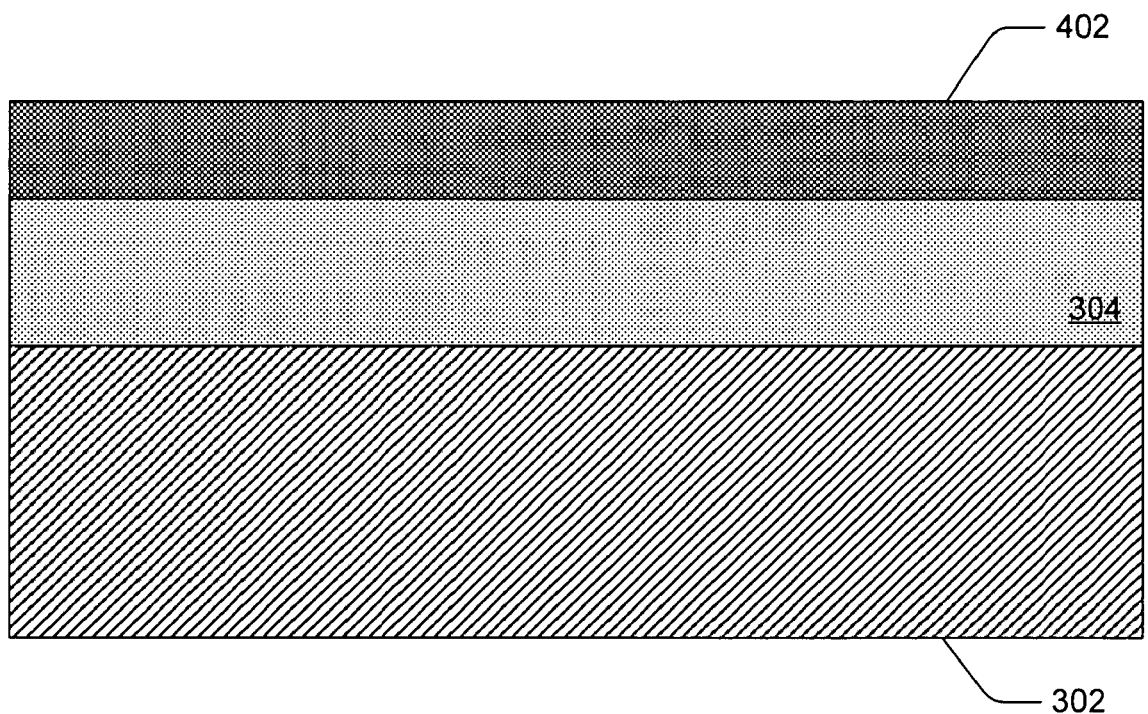
FIG. 4 illustrates a cross-sectional view of an exemplary substrate, surface layer, and patternable layer.

FIG. 4 sets forth a cross-sectional view of an example of the substrate 302, the surface layer 304, and a patternable layer 402. The patternable layer 402 can be of various types of materials that can be differentiated. The thickness of the patternable layer 402 can be chosen based on the etch rate of the patternable layer 402, the etch rate of the surface layer 304, and the desired dimensions of ridges. In one embodiment, the patternable layer 402 is from about 0.5 to five microns in thickness.

At block 206 the platform 100 exposes, in at least one implementation in which the patternable layer 402 is formed from photoresist, parts of the patternable layer 402 to radiation. By so doing, the platform 100 creates a pattern in the patternable layer 402.

In one implementation of block 206, the patternable layer 402 is fluid and the platform 100 exposes a pattern of the fluid patternable layer 402 to solidify the exposed pattern. By so doing the platform can then differentiate the exposed pattern from the unexposed parts of the patternable layer 402.

In a second implementation of block 206, the patternable layer 402 is solid and the platform 100 exposes parts of the solid patternable layer 402 to fluidify all but a particular pattern. This leaves the pattern in the solid patternable layer 402. The platform 100 can also differentiate exposed from unexposed parts of the patternable layer 402 in other manners, such as by altering an etch or vaporization rate of exposed parts of the patternable layer 402 and then preferentially removing the exposed or unexposed parts.

In both of these implementations of block 206, the platform 100 can use a lithographic mask to preferentially expose parts of the patternable layer 402 to create a pattern. The platform 100 can also create a certain pattern using a laser, or in other manners known in the art for exposing materials to radiation.

Figure 5:
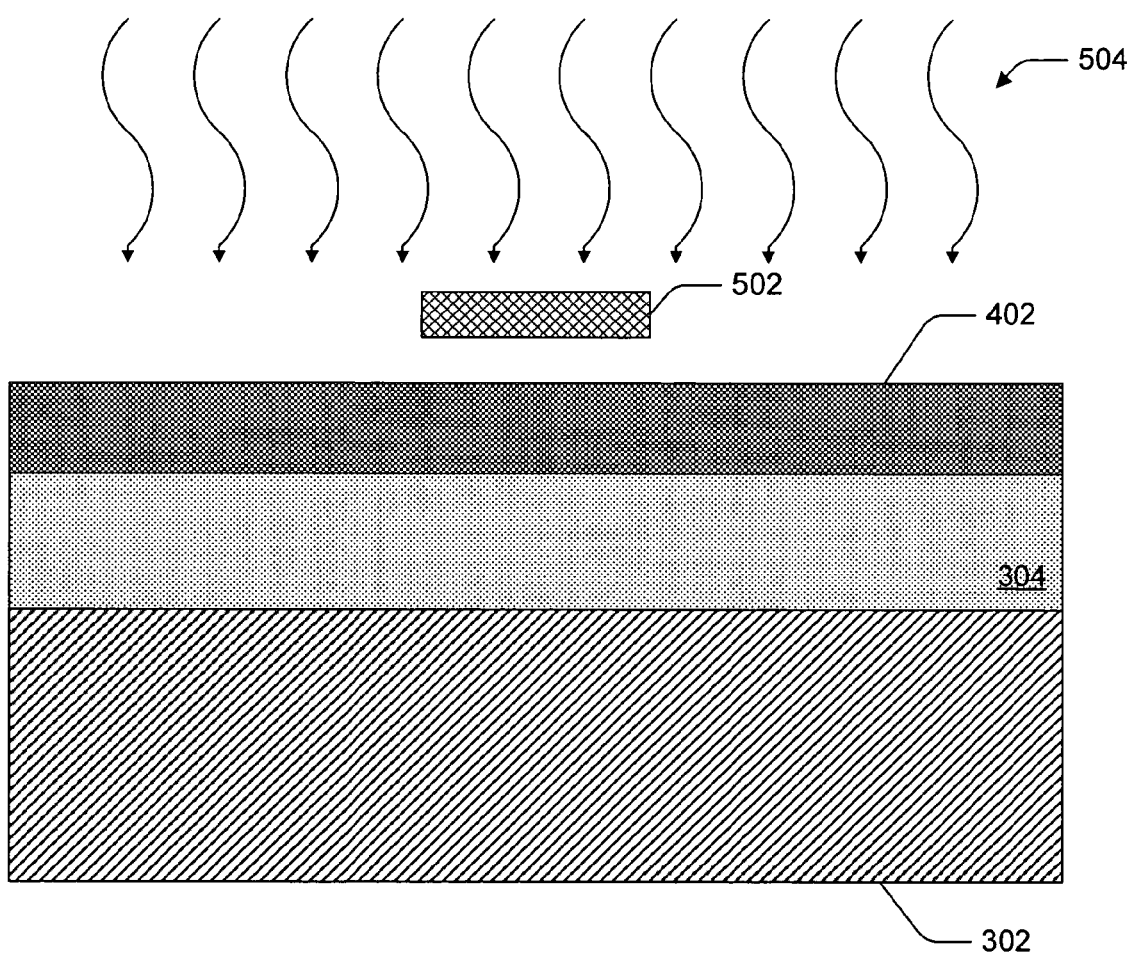
FIG. 5 illustrates a cross-sectional view of an exemplary substrate, surface layer, patternable layer, lithographic mask, and radiation.

FIG. 5 sets forth a cross-sectional view of examples of the substrate 302, the surface layer 304, the patternable layer 402, a lithographic mask 502, and radiation 504. In an example of the second implementation of block 206 above, the platform 100 exposes parts of the patternable layer 402 using the mask 502 to leave a pattern in the unexposed parts. Here the mask prevents parts of the patternable layer 402 from being exposed. These parts can be the pattern desired in the patternable layer 402. After exposure, the platform 100 removes the mask.

In another example of the second implementation, the patternable layer 402 includes photoresist, as an example, SPR 3625 (Shipley Positive Resist 3625), sensitive to being fluidified by ultra-violet (UV) radiation, the radiation 504 includes UV radiation, and the mask 502 is resistant to transmitting UV radiation. Also in this example, the surface layer 304 includes a low-stress TEOS.

At block 208 the platform 100 removes the unpatterned portion of the patternable layer 402. By so doing, the platform 100 differentiates between a patterned and unpatterned parts of the patternable layer 402 to leave the patterned parts of the patternable layer 402 on the surface layer 304. As mentioned above, the platform 100 can remove the unpatterned parts in various ways based on the type of exposure performed in block 206 and the type of material applied in block 204. The platform 100 can use etching, vaporization, gravity (e.g., pouring off fluidified parts of the patternable layer 402) and the like.

Figure 6:
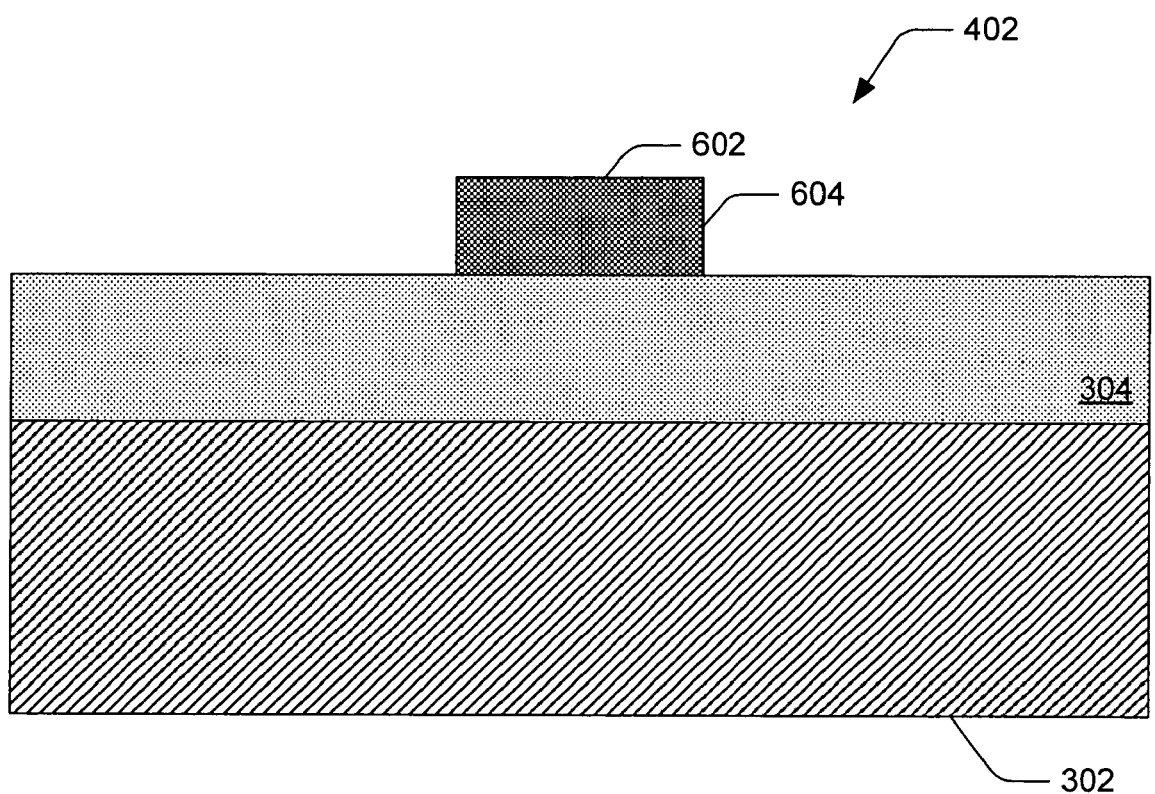
FIG. 6 illustrates a cross-sectional view of an exemplary substrate, surface layer, and pattern in a patternable layer.

FIG. 6 sets forth a cross-sectional view of examples of the substrate 302, the surface layer 304, and a pattern 602 in the patternable layer 402. FIG. 6 shows the patternable layer 402 after the platform 100 has removed unpatterned parts of the patternable layer 402, leaving the pattern 602.

Techniques for forming the pattern 602 set forth above are exemplary and provided as examples. Other methods for forming the pattern 602 may also be employed. The pattern 602 can also be formed, for instance, using imprint lithography and e-beam formation.

In the ongoing example, the platform 100 has exposed, with UV radiation, parts of the patternable layer 402 made up (or previously made up) of photoresist SPR 3625 and removed those parts to leave the pattern 602.

At block 210 the platform 100 alters a slope of sidewalls of the pattern 602 of the patternable layer 402.

In one implementation, angles of sidewalls 604 of the pattern 602 are altered to have an angle relative to the surface layer 304 beneath the pattern 602 of between about ten and ninety degrees. In another implementation, the angle of the sidewalls 604 is altered to about thirty to ninety degrees. Moderate angles above thirty degrees aid in later processing of thin material layers used to build a superlattice, discussed below. Very high angles (over ninety degrees) may cause structural instability in these thin material layers. Very low angles (less than ten degrees) can cause eventual wires built on the superlattice to be wider and with a wider pitch, which is sometimes not desired.

In the ongoing example, the pattern 602 includes photoresist SPR 3625, which can be heated to alter its cross-sectional shape. Thus, through baking a photoresist at higher temperature (also called "hard baking"), a sharp angle of the sidewalls 604 of the pattern 602 can be altered to an acute angle. As shown in FIG. 6, this exemplary pattern 602 has the (unaltered) sidewalls 604 having an angle of about ninety degrees relative to the surface layer 304. Through baking, the pattern 602 becomes more dome-like, thereby altering the sidewalls' 604 angle. The angle can be chosen in this case by the time and temperature of the baking, including angles of thirty or more degrees.

Figure 7:
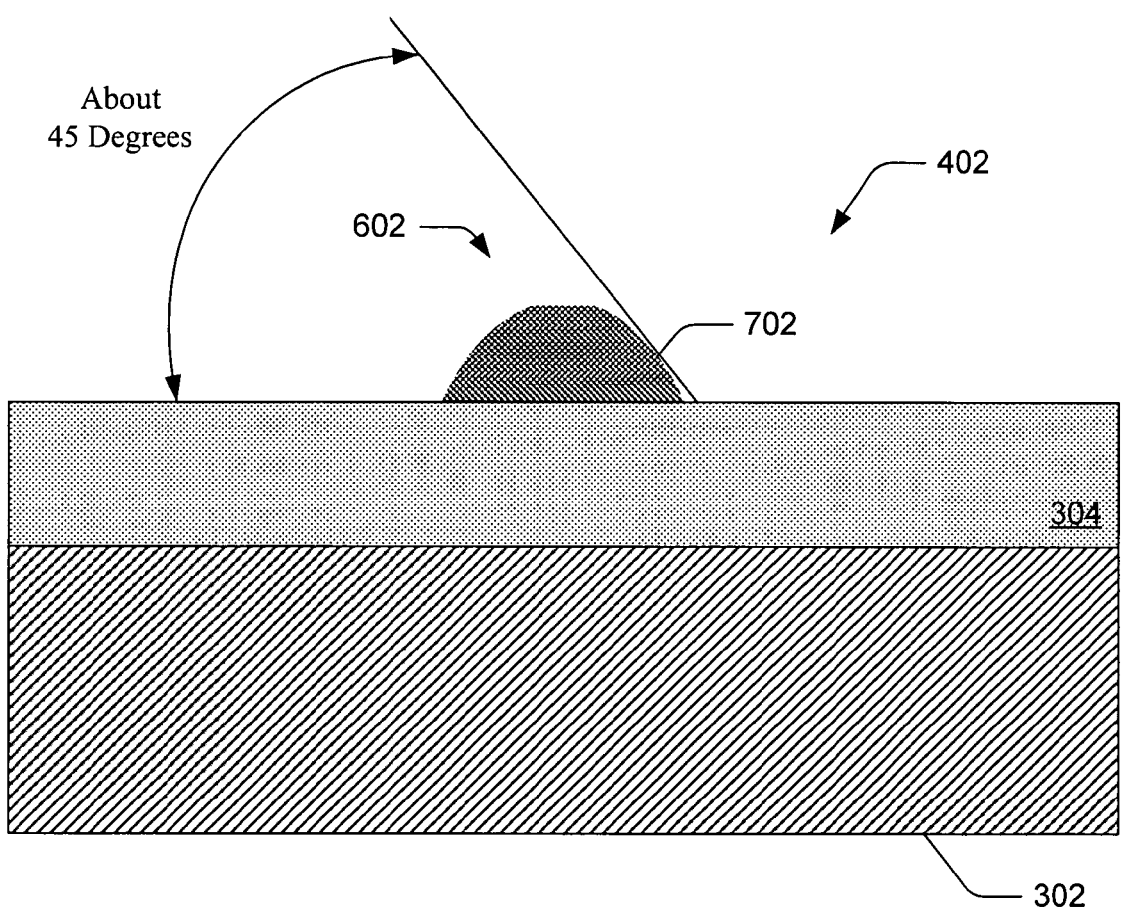
FIG. 7 illustrates a cross-sectional view of an exemplary substrate, surface layer, and pattern in a patternable layer having altered sidewalls.

FIG. 7 sets forth a cross-sectional view of an example of the substrate 302, the surface layer 304, and the pattern 602 having altered sidewalls 702. FIG. 7 shows the pattern 602 after the sidewalls 604 have been altered by the platform 100.

In the ongoing example, the pattern 602 is baked until the pattern's 602 cross-sectional shape has sidewalls of a desired angle. In this example the angle of the altered sidewalls 702 is about forty-five degrees, shown in FIG. 7.

At block 212 the platform 100 etches the pattern 602 of the patternable layer 402 and the surface layer 304 to create ridges. The ridges can be built from the surface layer 304 by the etchant etching away the pattern 602 and the surface layer 304, but in so doing the pattern 602 protects part of the surface layer 304 from the etchant, thereby leaving a ridge of the surface layer's 304 material.

Figure 8:
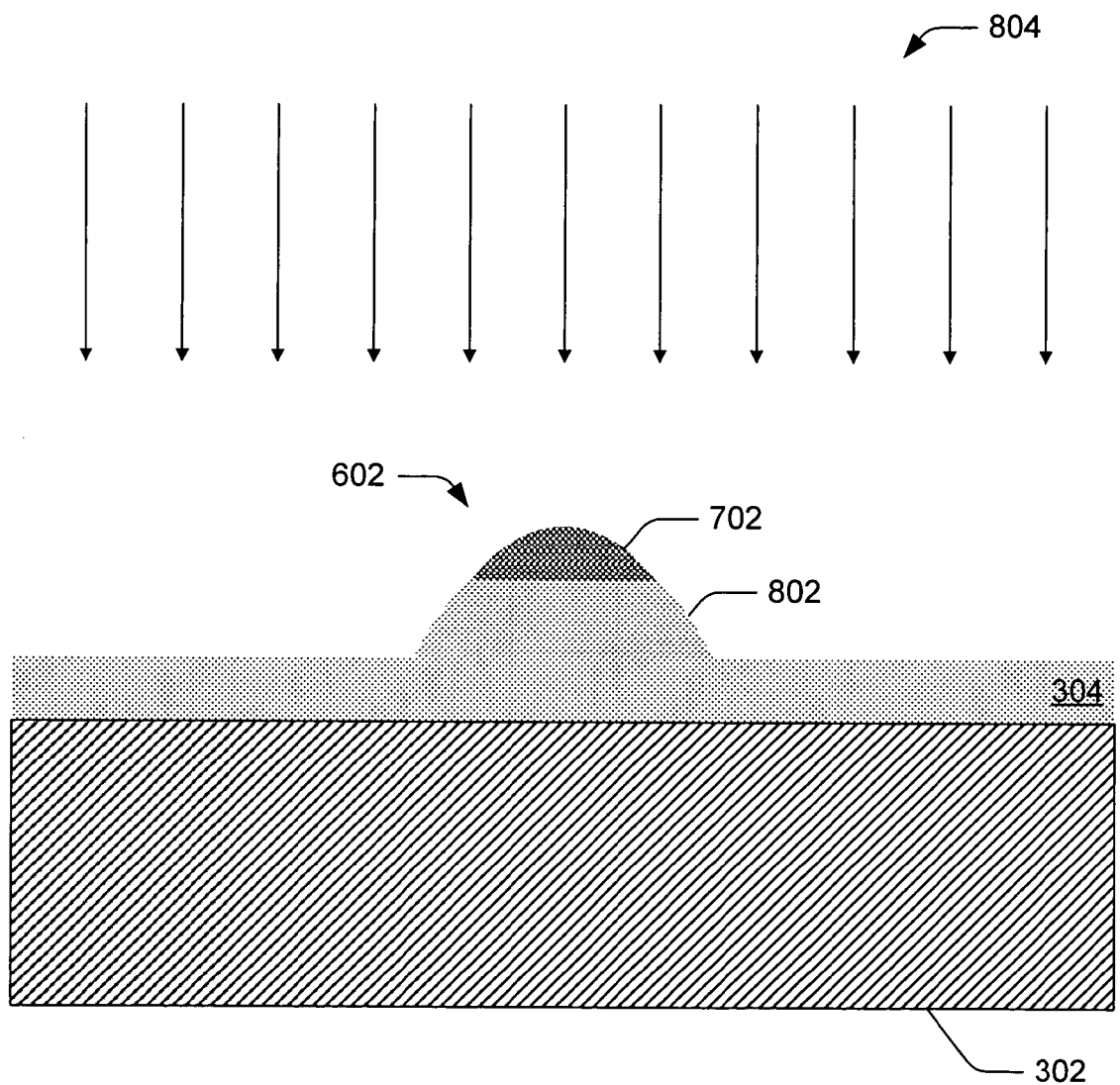
FIG. 8 illustrates a cross-sectional view of an exemplary substrate, etchant, and partially etched surface layer and pattern in a patternable layer having altered sidewalls.

FIG. 8 sets forth a cross-sectional view of an example of the substrate 302, a partially etched example of the surface layer 304, a partially etched example of the pattern 602 and the altered sidewalls 702, in-process surface layer sidewalls 802, and an etchant 804. FIG. 8 shows an example of the etching of block 212 in progress. As shown in this example, the in-process surface layer sidewalls 802 are geometrically similar to the altered sidewalls 702 of FIG. 7.

In one implementation, material of the pattern 602 and the surface layer 304 have different etch rates. By controlling the etch rates (either by picking a composition of the pattern 602, the surface layer 304, the etchant, or the condition of etching) a ridge resulting from the etching can be made geometrically similar to the pattern 602 and the altered sidewalls 702. Dry etching, for instance, can be used to reproduce the shape of the pattern 602 in the surface layer 304. This dry etching allows for uniformity of etching the materials of the pattern 602 and the surface layer 304.

These different etch rates can be substantial, including the pattern 602 having an etch rate from fifty to 150 percent greater than the etch rate of the surface layer 304, for a particular etchant used. The pattern 602 can have a faster etch rate to aid in a ridge built having angled sidewalls with angles similar to the altered sidewalls 702. Other etch rate differences can also be chosen, some of which will allow for a ridge to have sidewalls with angles more than or less than the angle of the altered sidewalls 702, or even a concave shape.

Also in the ongoing example, the material of the pattern 602 has an etch rate about fifty percent faster than the etch rate of the surface layer 304. The pattern 602 is etched away, as is the surface layer 304, until the pattern 602 is substantially gone and the surface layer 304 is substantially gone except for remaining ridges.

Figure 9:
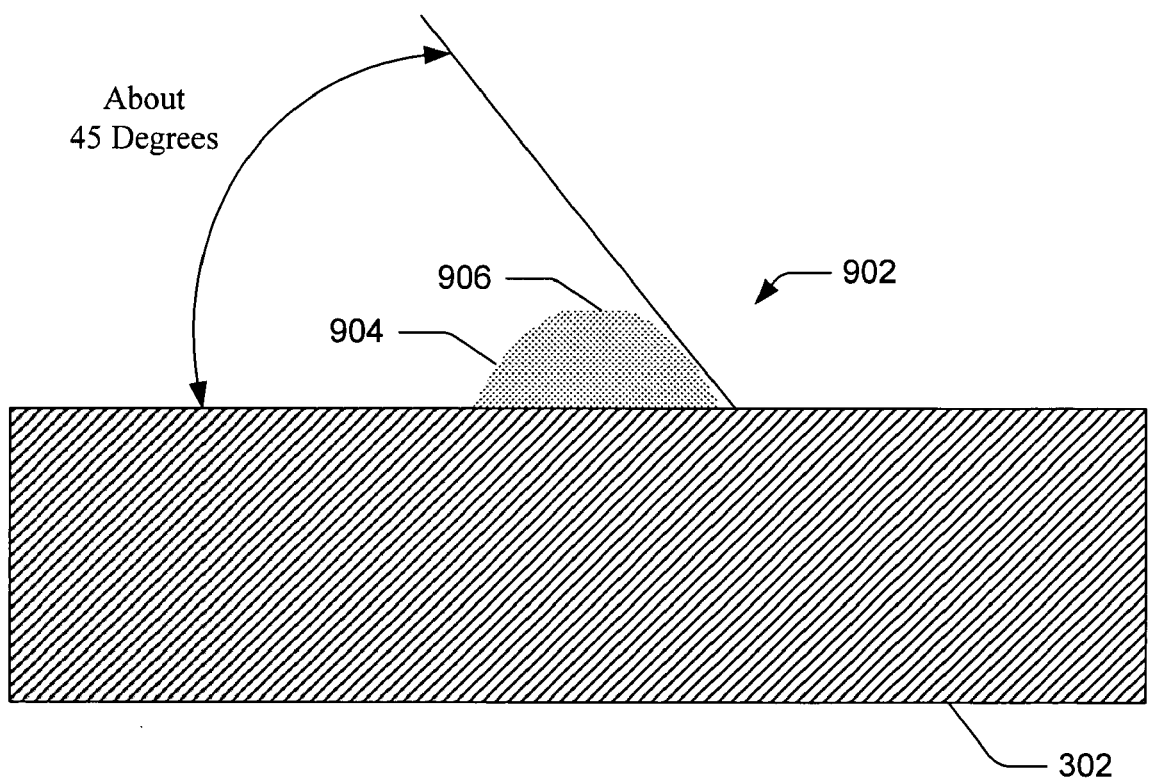
FIG. 9 illustrates a cross-sectional view of an exemplary substrate and ridge having sidewalls and a top.

FIG. 9 sets forth a cross-sectional view of an example of the substrate 302 and a ridge 902 (of the surface layer 304) having ridge sidewalls 904 and a ridge top 906. As shown in this example, the ridge sidewalls 904 are geometrically similar to the altered sidewalls 702 of FIG. 7.

In the ongoing example, the etchant 804 is applied until the ridge 902 remains, as shown in FIG. 9. In this example the angle of the ridge sidewalls 904 is about forty-five degrees, shown in FIG. 9.

FIG. 10 sets forth a three-dimensional view of an example of the substrate 302 and the ridge 902 having the ridge sidewalls 904 and the ridge top 906. This example shows a short slice of the ridge 902. FIG. 10 also shows thickness, width, and length dimensions.

Figure 11:
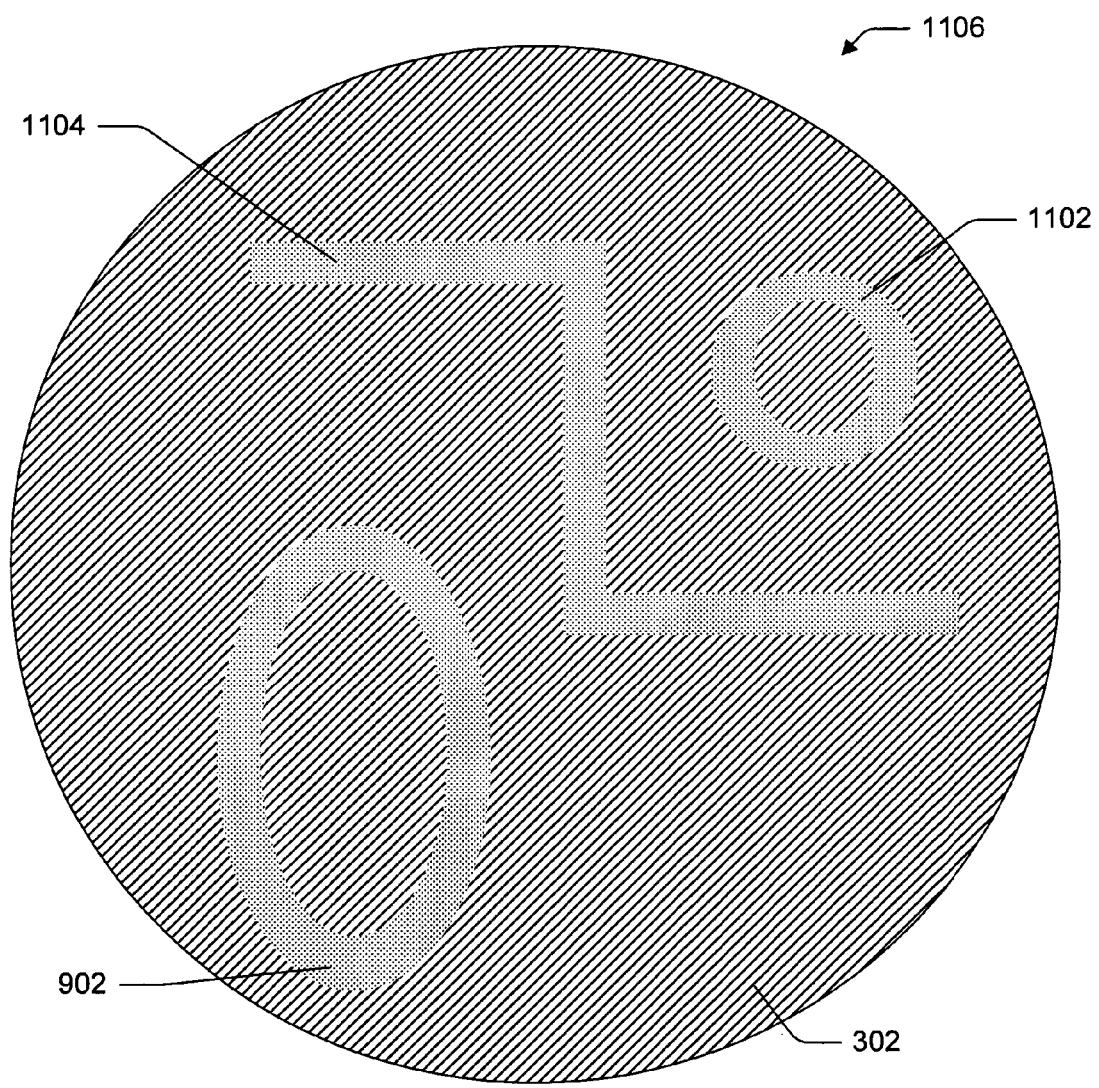
FIG. 11 illustrates a top plan view of an exemplary substrate, ridge, circular ridge, and zig-zag ridge.

FIG. 11 sets forth a top plan view of an example of the substrate 302, the ridge 902, a circular ridge 1102, and a zig-zag ridge 1104. This view shows how ridges can be built having near-arbitrary length and curvature. In this example the ridge 902 has an elliptical curvature, the ridge 1102 has a circular curvature, and the ridge 1104 has a zig-zag shape. Also, the substrate 302 is shaped into a die 1106. The die 1106 can be very small to centimeters across. These ridges are provided as examples; other shapes and curvatures can also be produced using the process 200.

Techniques for forming the ridge 902 set forth above are exemplary and provided as examples of ways in which to form the ridge 902. Other methods for forming the ridge 902 may also be employed. The ridge 902 can also be formed, for instance, using imprint lithography and e-beam formation. In one implementation the ridge 902 is formed with the ridge sidewalls 904 substantially vertical relative to the surface layer 304.

The ridge 902 can be used to aid in creating a superlattice, described in greater detail below.

Fabricating a Superlattice on a Ridged Substrate

Figure 12:
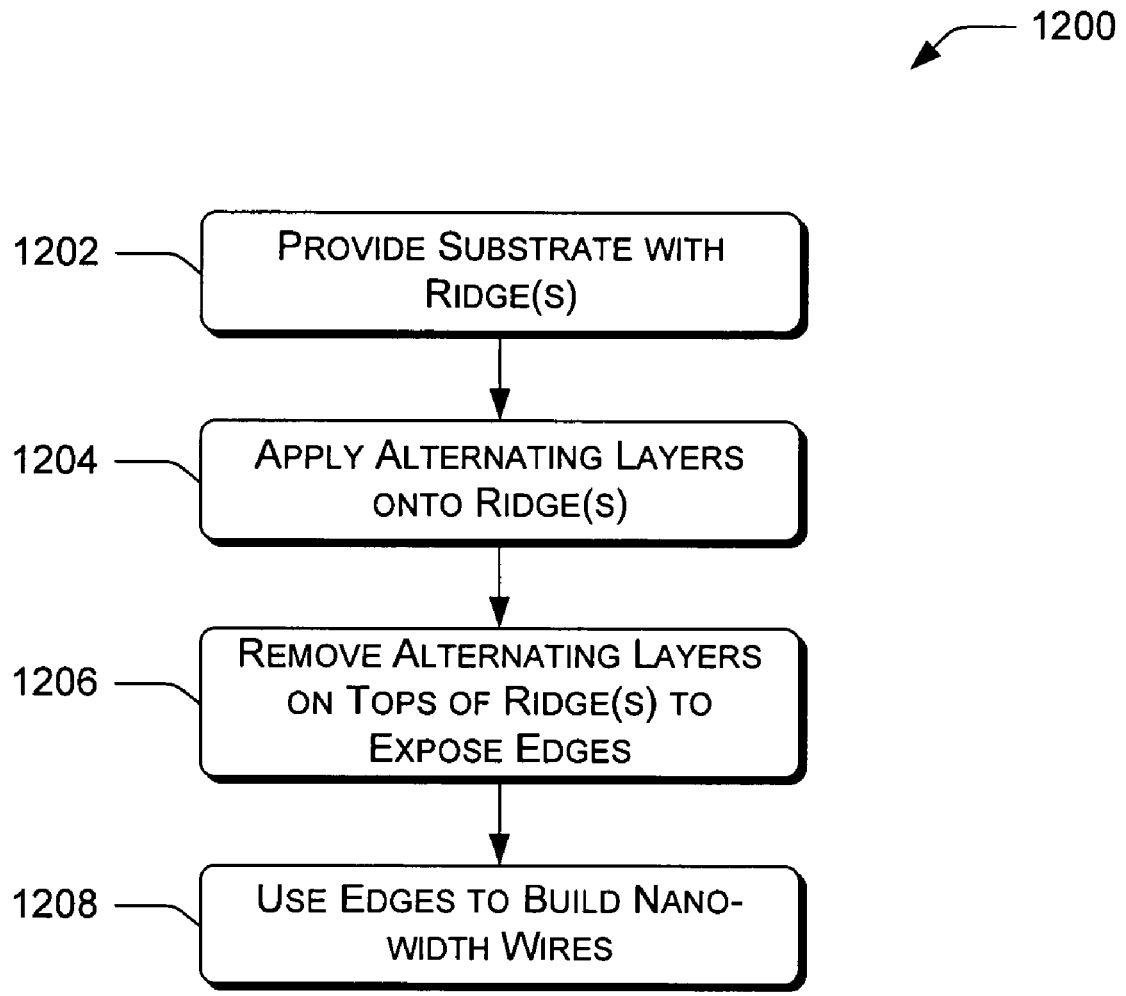
FIG. 12 is a flow diagram of an exemplary method for fabricating a superlattice on a ridged substrate.

FIG. 12 shows a flow diagram of a process 1200 for an exemplary method for fabricating a superlattice on a ridged substrate. By following this exemplary process, the platform 100 can build a superlattice having layers with exposed edges of a near-arbitrary length and curvature. These edges can be used to fabricate arrays of curved, non-linear, and tightly spaced nano-wires. Following this discussion, use of these superlattices to create nano-wire arrays will also be discussed.

At block 1202 the platform 100 provides a substrate with ridges. The provided substrate with ridges can be of many different types.

The substrate can be large or small, and thick or thin. It can be made to match a size of a circuit board or die on which an array of nano-wires built on the substrate is later to be applied. This process 1200 allows for forming a superlattice, and an array of nano-wires, of many different sizes. By so doing, the array can be made to closely match a size and shape that is desired. This flexibility of shape and size allows for an array of nano-wires to match its application, allowing for as little as one array to be fabricated for an application, rather than multiple arrays needed to be made and joined together.

The ridges on the substrate can also be of many different types. These ridges can be very thin (shown by the thickness dimension in FIG. 10), allowing for exposed edges of material layers on either side of the ridge to be very close together. These ridges can be thick, allowing for sets of parallel exposed edges that are far apart. These ridges can also be of nearly arbitrary shape and length. The shape of the ridges, as shown below, can be reflected in the shape of exposed material edges with which nano-wires can be built. Further, these ridges can have various slopes to their sidewalls, allowing one way to vary thicknesses of exposed edges of a superlattice.

In the following description of the process 1200, the substrate 302 and the ridge 902 will be used as examples. These examples are not intended to be limiting on the applicability of the process 1200; other substrates, and shapes and types of ridges can be used by the process 1200 to create a superlattice having nearly arbitrary shaped exposed edges.

At block 1204 the platform 100 applies alternating material layers on the ridge 902, such as with physical vapor deposition (PVD). The materials in the layers alternate so that when edges of the layers are later exposed, the layers exposed can have different characteristics than adjoining layers.

Figure 13:
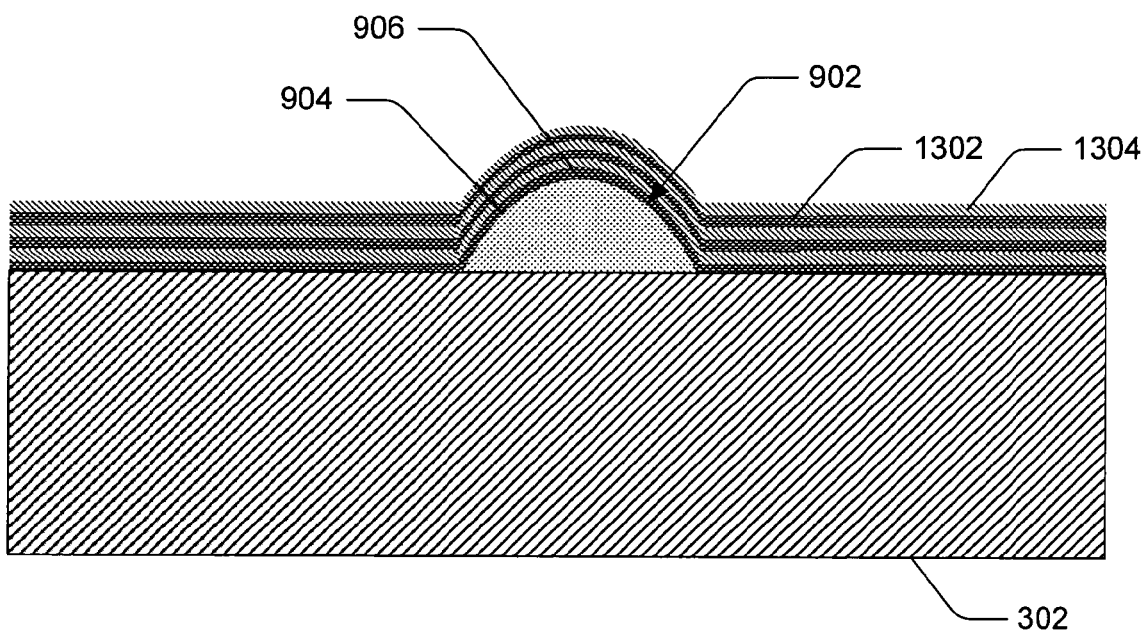
FIG. 13 illustrates a cross-sectional view of an exemplary substrate, ridge having sidewalls and a top, and two alternating material layers.

FIG. 13 sets forth a cross-sectional view of examples of the substrate 302, the ridge 902 having the ridge sidewalls 904 and the ridge top 906, and two alternating material layers, first material layers 1302 and second material layers 1304. As shown in this example, three layers of the first material layers 1302 and three layers of the second material layers 1304 are applied.

Each of the layers 1302 and 1304 can be of various thicknesses, including from nanometer in scale to micrometer and deeper in scale, though at least one of the layers is nanometer (about one to one hundred nanometers) in thickness, so that when the layer is exposed it is about nanometer-scale in width. Each of the layers 1302 and 1304 can, for instance, be created with a thickness of less than 10 nanometers, 10-15 nanometers, 15-20 nanometers, and 20 to 50 nanometers or more, or combinations thereof. The smallest layer thicknesses can be used to produce wire arrays of the highest density and wires that exhibit extreme size-dependent properties such as quantum effects. The larger layer thicknesses provide for classical non-quantum properties, easier manufacturability, greater electrical conductance, more surface area, and less dense arrays. In this example, the layers 1302 and 1304 are applied at a thickness of about thirty nanometers.

Further, the thickness of some of the layers 1302 and 1304 can affect the process of creating a spacing (or "pitch") between wires. The wire pitch/spacing is important, affecting the properties of wires and an array fabricated using the superlattice.

The layers 1302 and 1304 can be applied in various manners. They can be applied with chemical vapor deposition, sputtering and other methods of physical vapor deposition, atomic layer deposition, electroplating, Langmuir-Blodgett techniques, and the like.

In one implementation, physical vapor deposition of a type that is not particularly directionally sensitive, chemical vapor deposition, or atomic layer deposition, can be used to uniformly layer material over the ridge 902. In this implementation (not shown), the ridge sidewalls 904 can have angles around ninety degrees and be uniformly layered with the layers 1302 and 1304.

The layers 1302 and 1304 can also include many different types of materials. They can be made of conductive materials and non-conductive materials. Of conductive materials, the layers 1302 and 1304 can include one or more metals such as platinum, beryllium, aluminum, palladium, tantalum, nickel, gold; metallic alloys; a ceramic such as indium tin oxide, vanadium oxide, or yttrium barium copper oxide; an electrically semiconductive material such as silicon, diamond, germanium, gallium arsenide, cadmium telluride, zinc oxide, silicon carbide, tin oxide, indium tin oxide; and/or other elemental, binary, and multi-component materials, for instance. Of the non-conductive materials, the layers 1302 and 1304 can include aluminum oxide, various other oxides, and other insulating materials that can be deposited in small-thickness layers. The choice of material combination will be application-specific, and the process can be made to work with most any solid material that can be deposited as a small-thickness layer, including "soft" materials like polymers. Also, the layers 1302 and 1304 can be single-crystalline and/or in epitaxial relationship. Epitaxial refers to the perfect or near-perfect lattice registry of one material to another material upon which it is deposited.

Both the layers 1302 and 1304 can be conductive, semiconductive, insulative, or one of them can be conductive and the other an insulator. In cases where both are conductive, one of their exposed edges (discuss below) can be treated to be non-conductive or removed. To aid in doing so, the platform 100 can apply materials having different nitridation, oxidation, or etching rates.

Both of the layers 1302 and 1304 can include more than one material. The first material layers 1302 can, for instance, include layers some of which include gold, some of which include tantalum, some of which include nickel, and the like.

In one implementation of block 1204, the platform 100 applies additional layers to aid the platform 100 in removing parts of the layers 1302 and 1304. These additional layers can include a stop layer and a fill layer, each of which is intended to aid certain types of removal processes.

Figure 14:
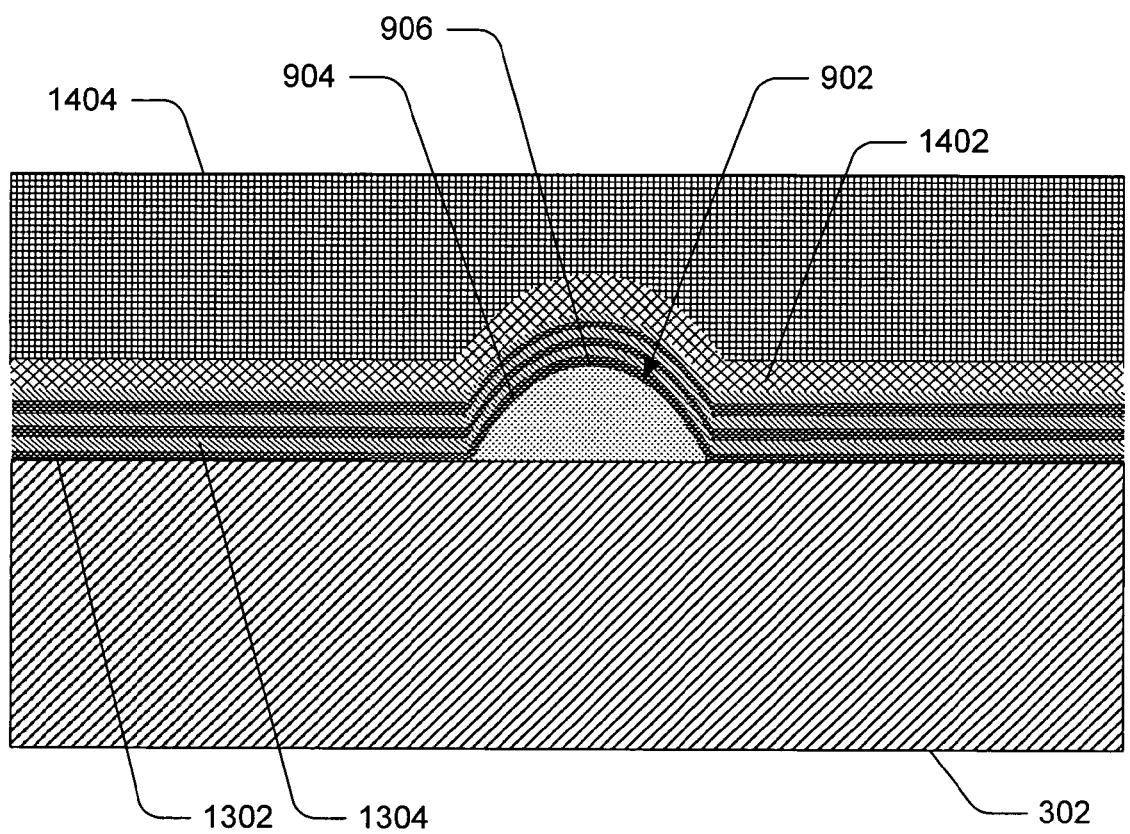
FIG. 14 illustrates a cross-sectional view of an exemplary substrate, ridge having sidewalls and a top, two alternating material layers, a fill layer, and a stop layer.

FIG. 14 sets forth a cross-sectional view of examples of the substrate 302, the ridge 902 having the ridge sidewalls 904 and the ridge top 906, the first material layers 1302 and the second material layers 1304, and a stop layer 1402 and a fill layer 1404.

At block 1206 the platform 100 removes the layers 1302 and 1304 from the ridge top 906 of the ridge 902. By removing parts of the layers 1302 and 1304 that are exposed on the ridge top 906, edges of the layers 1302 and 1304 are exposed.

In one implementation, the platform 100 planarizes the layers 1302 and 1304 from the ridge top 906. This can be performed mechanically, chemically, or with a combination of both.

In a related implementation, the platform 100 planarizes, chemically and mechanically, the layers 1302 and 1304 from the ridge top 906, as well as part of the ridge top 902 (at the ridge top 906). In doing so, the platform 100 removes the fill layer 1404 and continues to remove a plane from the fill layer 1404 (and so on) until all of the stop layer 1402 is removed. Once the stop layer 1402 is removed, a top (non-ridged part) of the second material layers 1304 remains, as well as exposed edges of each of the layers 1302 and 1304.

Figure 15:
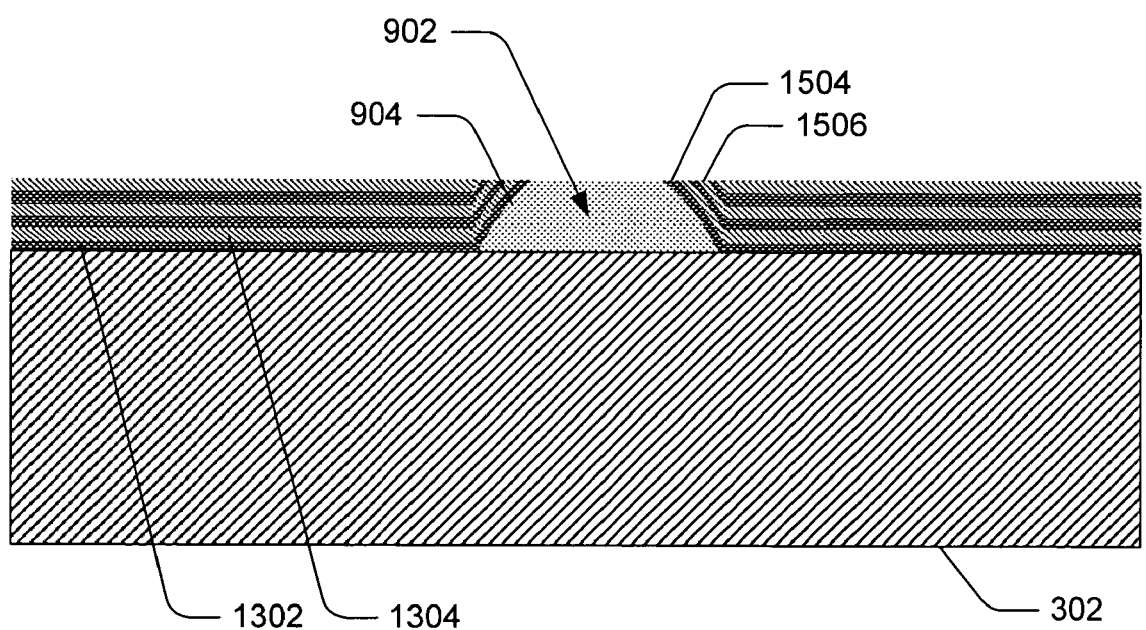
FIG. 15 illustrates a cross-sectional view of an exemplary substrate, ridge having sidewalls, two alternating material layers, and exposed edges of alternating material layers.

FIG. 15 sets forth a cross-sectional view of examples of the substrate 302, the ridge 902 having the ridge sidewalls 904, the first material layers 1302 and the second material layers 1304, and exposed first material layer edges 1504 and second material layer edges 1506.

As is shown in FIG. 15, the thickness of the layers 1302 and 1304, as well as the angle of the ridge sidewalls 904, affects the width of these exposed edges 1504 and 1506. When the layers 1302 and 1304 are applied to a smaller thickness or the slope of the ridge sidewalls 904 is at a higher angle, the thickness of the edges 1504 and 1506 is reduced, and vice-versa.

For example, if the thickness of the layers 1302 are applied to about thirty nanometers and the layers 1304 are applied to about sixty nanometers and the ridge sidewalls 904 have an angle around forty-five degrees, the thickness of the exposed edges 1504 and 1506 will be about forty-two and eighty-four nanometers, respectively. If wires are built on the layers 1302 and not on the layers 1304, a resulting array may have wires about forty-two nanometers thick with a pitch of about 128 nanometers.

Continuing this example, if the ridge 902 is curved along its length, the exposed edges 1504 and 1506 can follow the same curve along their lengths, be co-parallel, and be about forty-two and eighty-four nanometers thick, respectively.

With blocks 1202 to 1206 completed, a superlattice usable to build a nano-wire array can be complete. At this point the superlattice has the exposed edges 1504 and 1506 of the first and second material layers 1302 and 1304. The superlattice can be further processed, used to aid in forming arrays of wires, or ready to have wires built over the exposed edges 1504 or 1506 without further processing.

Figure 16:
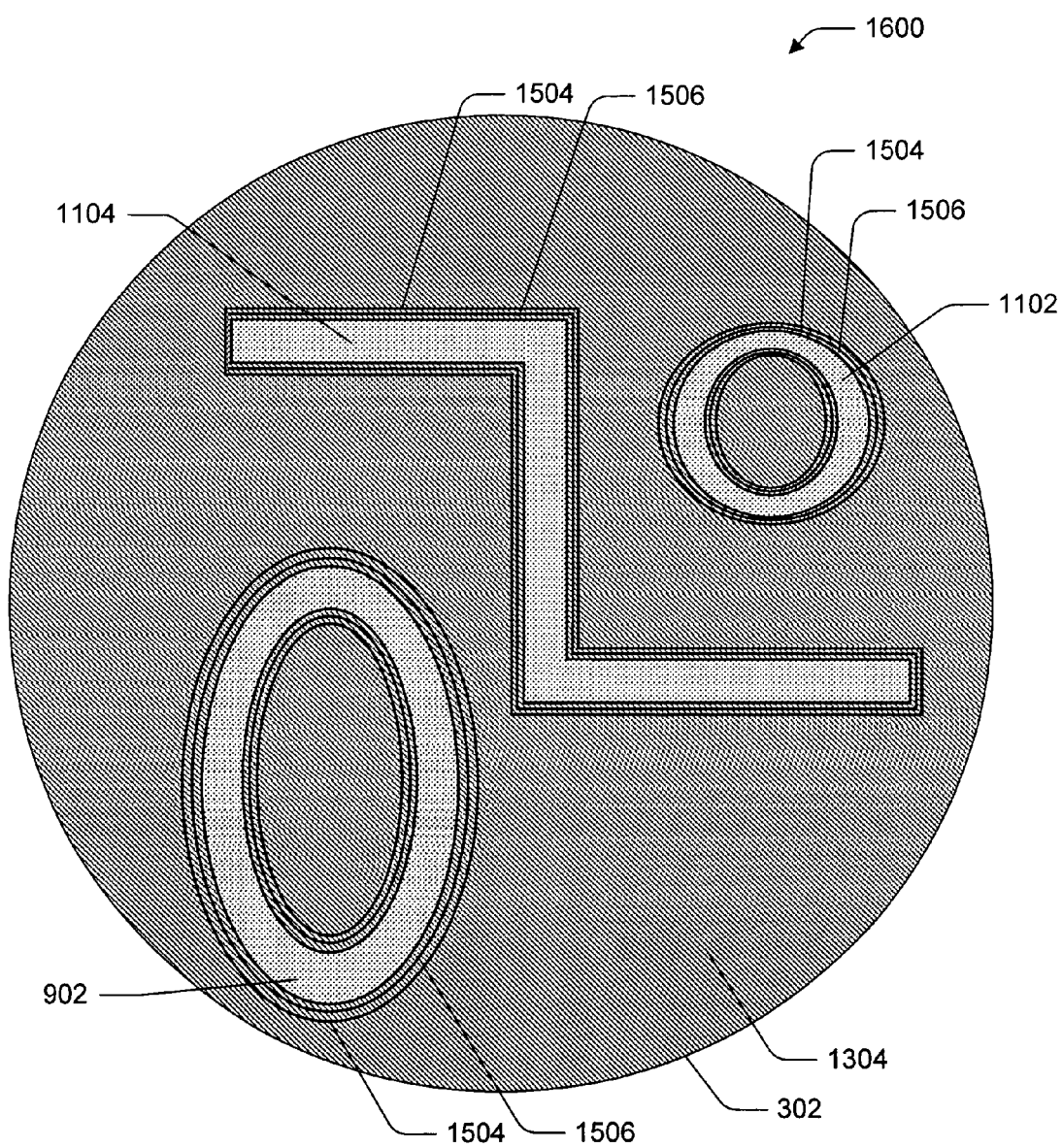
FIG. 16 illustrates a top plan view of an exemplary substrate, ridge, circular ridge, zig-zag ridge, and exposed edges of alternating material layers.

FIG. 16 sets forth a top plan view of an example of the substrate 302 (hidden below one layer of the second material layers 1304), the ridge 902, the circular ridge 1102, the zig-zag ridge 1104, and the first exposed edges 1504 and the second exposed edges 1506. This view shows how ridges allow for the exposed edges 1504 and 1506 to have a near-arbitrary length and curvature. In this example the edges 1504 and 1506 are also shown as built using the ridges 1102 and 1104, though these ridges and edges are optional.

Continuing the ongoing example, the exposed edges 1504 and 1506 following the ridge 902 are curved and co-parallel. The exposed edges 1504 and 1506 following the circular ridge 1102 are also curved and co-parallel. The exposed edges 1504 and 1506 of the zig-zag ridge 1104 are jagged; they follow the zig-zag length of the zig-zag ridge 1104, but are also co-parallel. In the example shown in FIG. 16, the exposed edges of each of the different ridges are co-parallel with other exposed edges for the same ridge, but not with exposed edges for other ridges. This shows one example of the nearly-arbitrary and flexible manner in which the exposed edges 1504 and 1506 can be built.

Exemplary Methods for Creating Nanowire Arrays Using a Superlattice

At block 1208 the platform 100 uses the superlattice 1600 to build an array of nano-width wires. The wires in this array can have a curved, non-linear, or nearly-arbitrary shape and curvature. In one implementation, the platform 100 further processes the exposed edges 1504 or 1506 to offset either the first edges 1504 or the second edges 1506 to corrugate them. The platform 100 can then use the offset edges to collect nano-sized objects, build wires, or stamp a malleable surface, for instance. A surface stamped in this way can then be used for other purposes. In one implementation, a stamped surface can be used for nano-imprint mold fabrication. In another implementation, a stamped surface can be used as ridges and troughs to build another superlattice or to build an array of nano-wires. The stamped surface can itself be, or be formed into, an array of nano-wires. In still another implementation, the platform 100 builds nano-wires directly on either the first exposed edges 1504 or the second exposed edges 1506.

Figure 17:
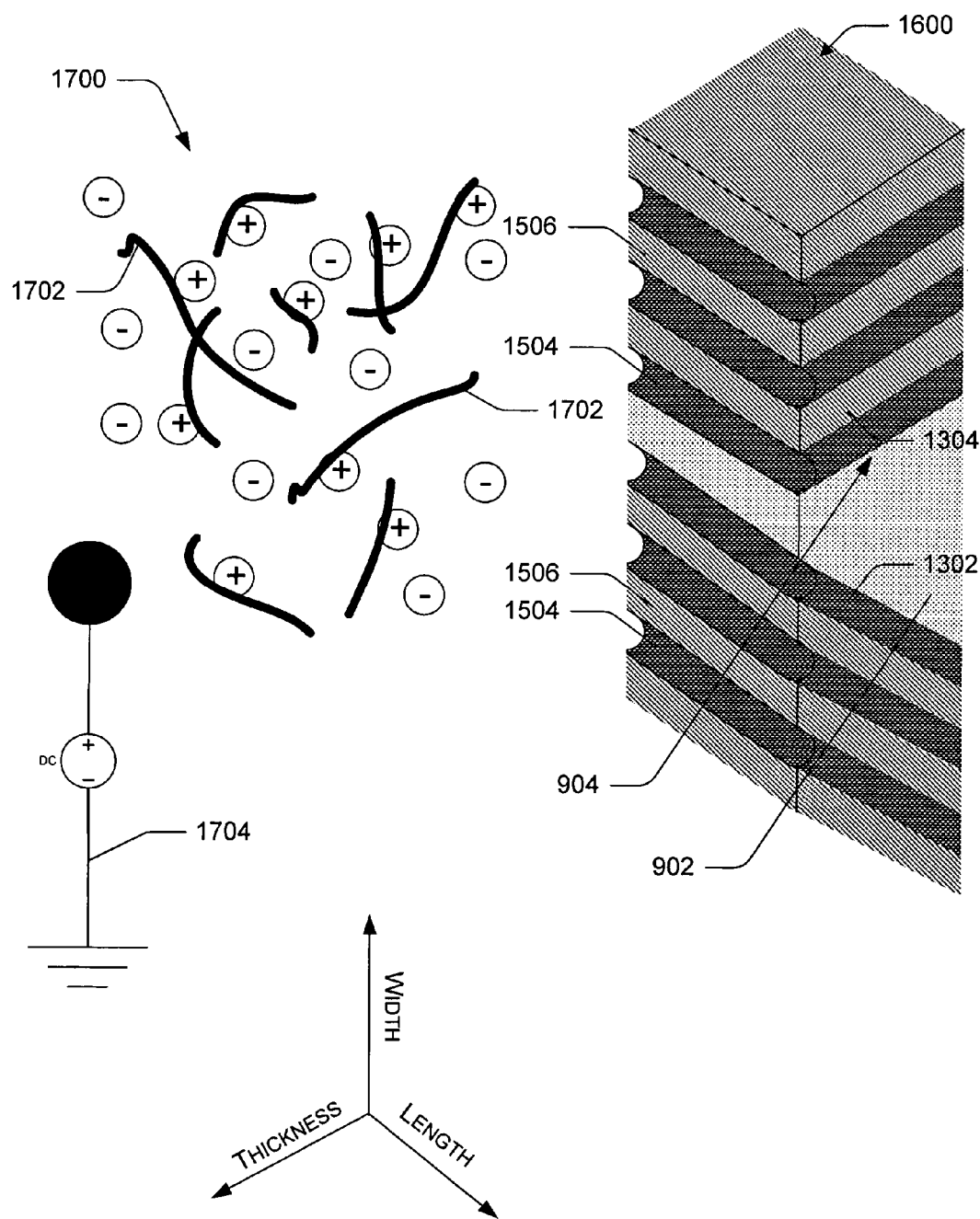
FIG. 17 illustrates a three-dimensional view of an exemplary small piece of a superlattice with off-set exposed edges and an exemplary charged bath with charged objects.

FIG. 17 sets forth a three-dimensional view of an example of a small piece of the superlattice 1600 with the exposed edges 1504 offset from the exposed edges 1506. This small piece is shown to aid in describing the following implementations for fabricating an array of nano-width wires. The piece of the superlattice 1600 is oriented as shown by the thickness, width, and length dimensions set forth in FIG. 17. The superlattice 1600 includes the ridge 902 and the ridge sidewalls 904 of the ridge 902. In this implementation the ridge sidewalls 904 have an angle of about 45 degrees relative to the substrate 302 (not shown) beneath the ridge 902.

In one implementation, the platform 100 charges the first edges 1504. The platform 100 can charge the first edges 1504 with an electrical source. For this example the first edges 1504 and the first material layers 1302 are conductive and the second edges 1506 are not conductive. Also in this implementation, the platform 100 places the first edges 1504 in a charged bath 1700 having charged nano-objects 1702 and an electrical power source 1704.

With the first edges 1504 charged, relative to the charged objects 1702, the voltage difference facilitates electrochemical transfer (through electrochemical, electrophoretic, or electrolytic deposition) of the charged objects to the first edges 1504. By so doing, the platform 100 can fabricate an array of the nano-objects over the superlattice 1600.

These charged objects 1702 can be collected within troughs made up of the offset, first edges 1504 and walled by the second edges 1506.

These charged objects 1702 can include nano-objects, which can be made up of many different kinds of materials, such as inorganic molecules, organic molecules, biological molecules, metal, semiconductor, or insulating nano-particles. They can also have various kinds of shapes and structures. They can include, for instance, single- and multi-wall carbon nanotubes of various chiralities; boron-nitride nanotubes; bundles and ropes of nanotubes; solid or hollow nanowires made of metals, semiconductors, conductive oxides, conductive polymers, or other conductive materials; insulating nano-rods; and conductive or insulating nano-needles.

The charged objects 1702 are collected sufficient to build an array of nano-wires made up of these charged objects 1702.

Figure 18:
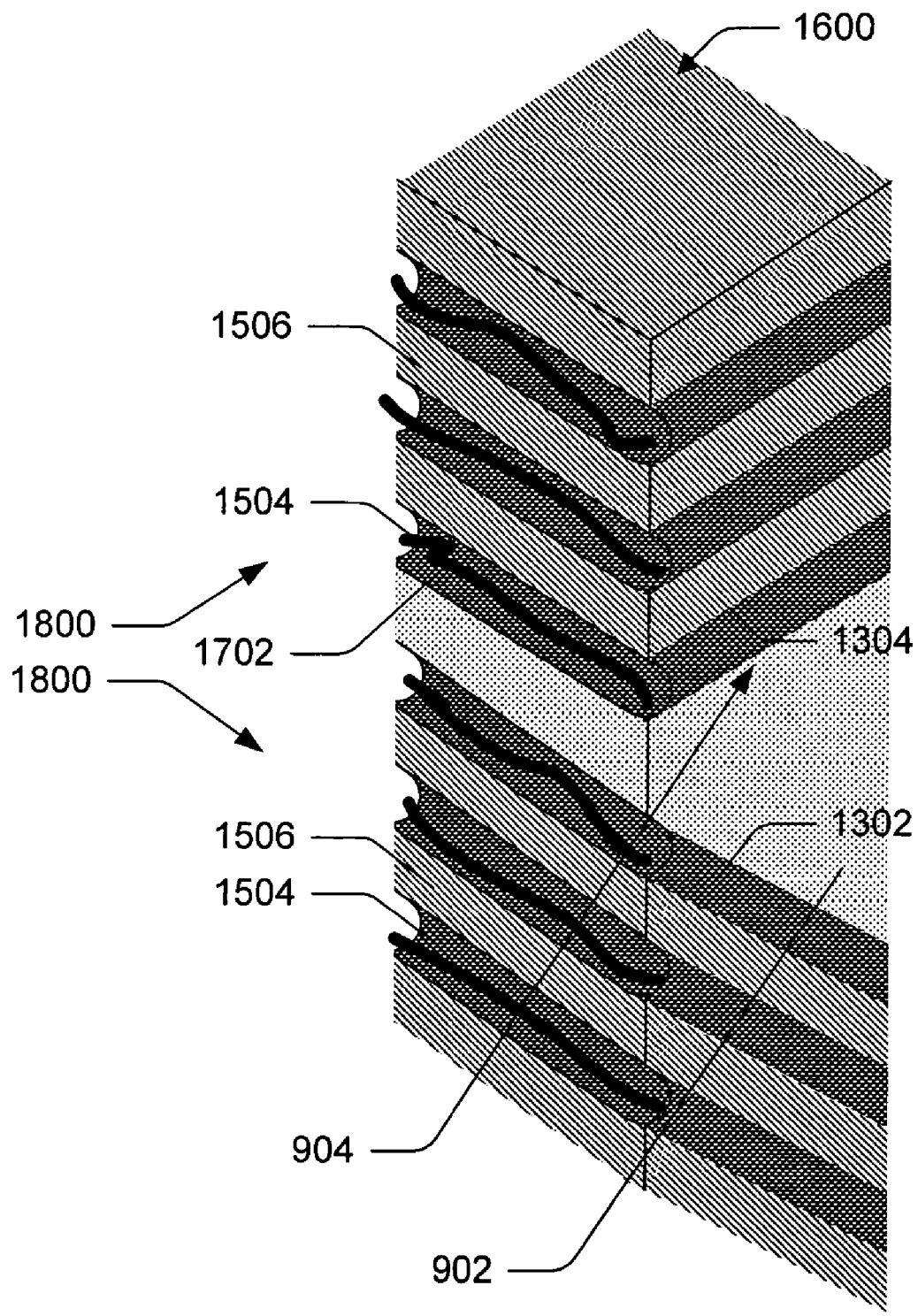
FIG. 18 illustrates a three-dimensional view of an exemplary small piece of a superlattice with off-set exposed edges and an exemplary part of an array of wires collected within the off-set exposed edges.

FIG. 18 sets forth a three-dimensional view of an example of a small piece of the superlattice 1600 with the exposed edges 1504 having collected the charged nano-objects 1702 into an array 1800. This exemplary piece of the superlattice 1600, like that shown in FIG. 17, is too small a piece to show a curvature along lengths of the first and second edges 1504 and 1506, though the superlattice 1600 can include such curvature, as discussed above.

In another implementation, small, charged ions of a particular material or materials (not shown) are collected by electrochemical, electrophoretic, or electrolytic deposition at either the edges 1504 or 1506. These ions can include gold, silver, tantalum, nickel, and the like. In this implementation, the platform 100 electrochemically collects the charged ions to build an array by attracting ions to conductive and charged edges of the superlattice 1600. The platform 100 can continue to collect the ions on or at the first edges 1504 or the second edges 1506 until wires of a desired width and/or cross-section are fabricated.

Also in this implementation, the width of these wires can be determined by a width of the first or second edges 1504 or 1506 that is charged. For instance, if the first edges 1504 are charged and thirty nanometers in width, wires built on these edges 1504 can be about thirty nanometers wide. Similarly, if the lengths of these first material edges 1504 are curved, co-parallel, and ten centimeters long, the wires built on them can be curved, co-parallel, and ten centimeters long. This is one example of how near-arbitrary lengths, curvature, and widths of exposed edges on the superlattice 1600 enables fabrication of near-arbitrary lengths, curvature, and widths of wires.

Figure 19:
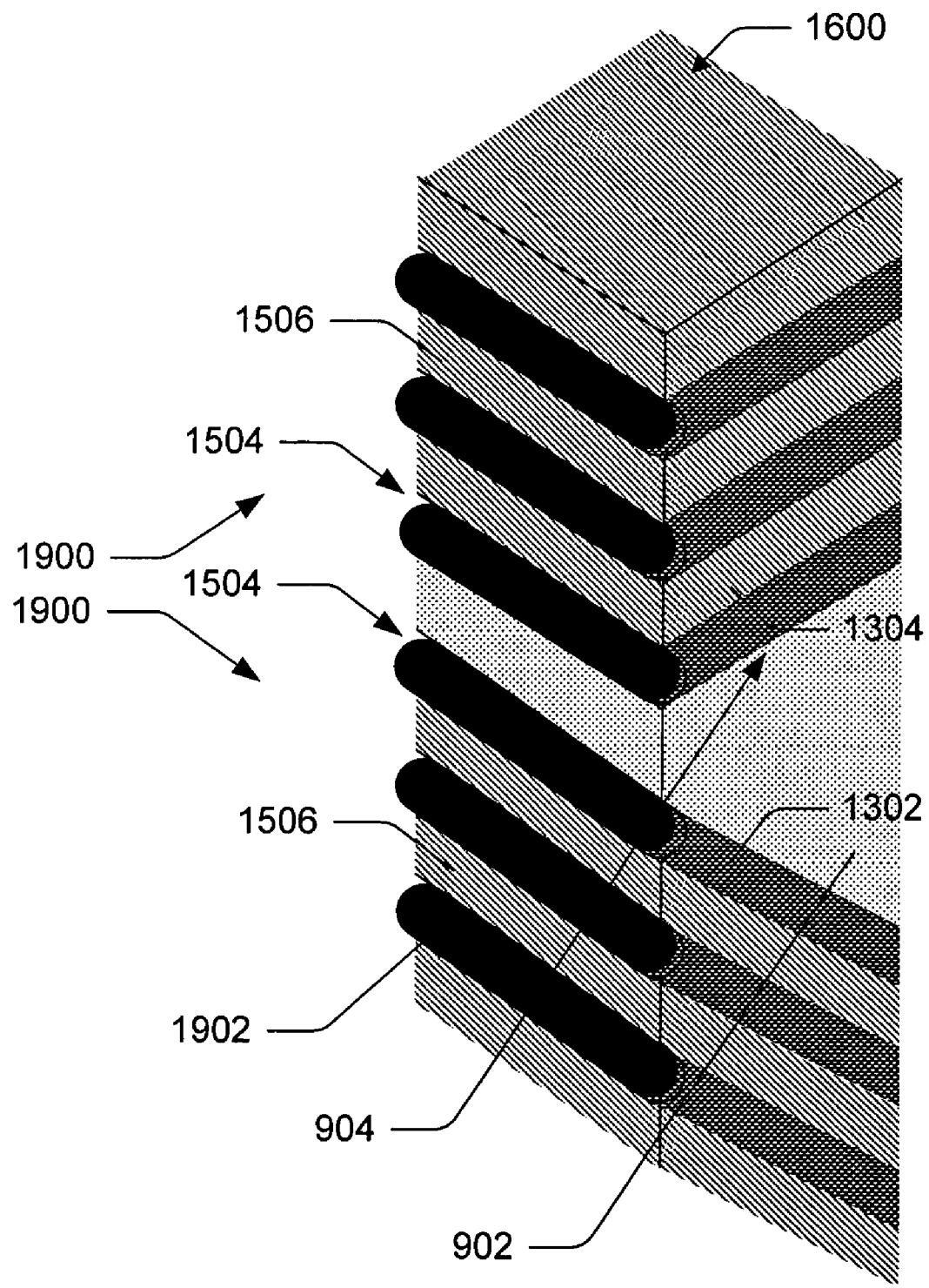
FIG. 19 illustrates a three-dimensional view of an exemplary small piece of a superlattice without off-set edges and an exemplary part of an array of wires over some of the exposed edges.

FIG. 19 sets forth a three-dimensional view of an example of a small piece of the superlattice 1600 with part of an array of nano-width wires 1900. A short section of wires 1902 of this array 1900 are shown fabricated on the first edges 1504. The first edges 1504, in this example, are not offset. In this example the wires 1902 are about fifteen nanometers wide and the pitch between them is also about fifteen nanometers. Three of the wires 1902 are separated from the other three of the wires 1902 by the width of the ridge 902, here about eighty nanometers.

A more complete example of a nano-wire array that can be built following the process 1200 is described below.

Figure 20:
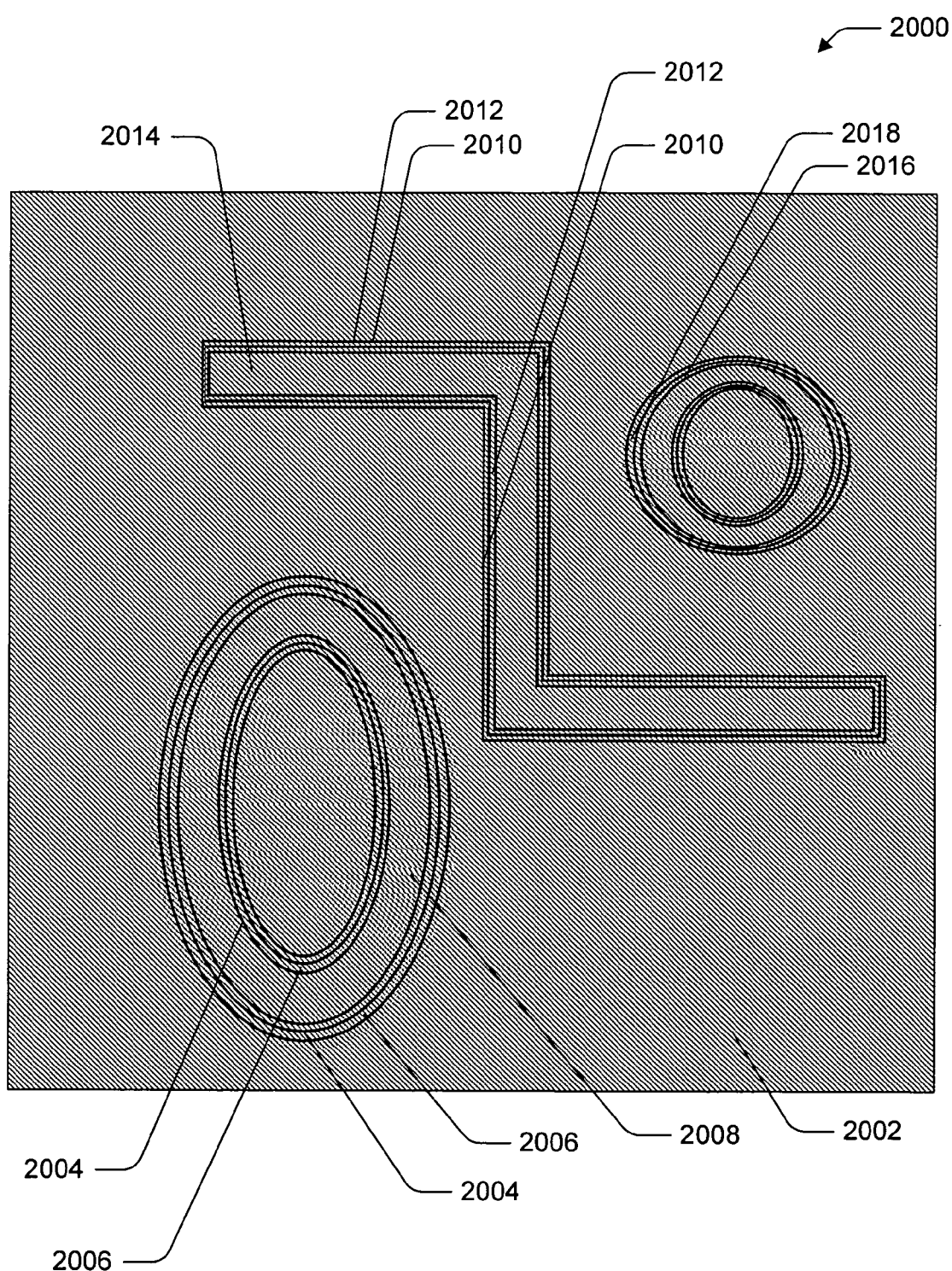
FIG. 20 illustrates a top plan view of an exemplary array of curved or non-linear nano-wires on a die.

FIG. 20 sets forth a top plan view of an example of an array of nano-wires 2000 on a die 2002. The array 2000 includes many different wires (or sub-arrays of wires). These wires are long and thin, such as a centimeter long and ten nanometers thick. These wires include six elliptical, curved and co-parallel wires 2004. These wires have a pitch between them shown at the elliptical pitch 2006. Some of the wires 2004 are separated by a distance 2008. As shown in FIGS. 11 and 15-19, this distance 2008 can depend on a width of the ridge 902.

Similarly, six zig-zag wires 2010 are shown, separated with a zig-zag pitch referenced at 2012. These wires 2010 are co-parallel with each other, some separated by a distance 2014. As shown in FIGS. 11 and 16, this distance 2014 can be dependent on a width of the zig-zag ridge 1104. Circular wires 2016 with a circular pitch 2018 are also shown.

The array of nano-wires 2000 can have wires made of many different materials, as described above. This array 2000 can be added to other arrays to create an even more complex array of wires, or can be broken up to create simpler arrays of wires (such as by transferring the zig-zag wires 2010 to another die or substrate). The array 2000 can be transferred to another substrate, in whole or in part.

Exemplary Method for Transferring Array

The array 2000 of wires 2004 can be transferred to another substrate in various manners, such as using physical transfer of the wires 2004 by contacting the wires 2004 with an adhesive layer of another substrate.

Figure 21:
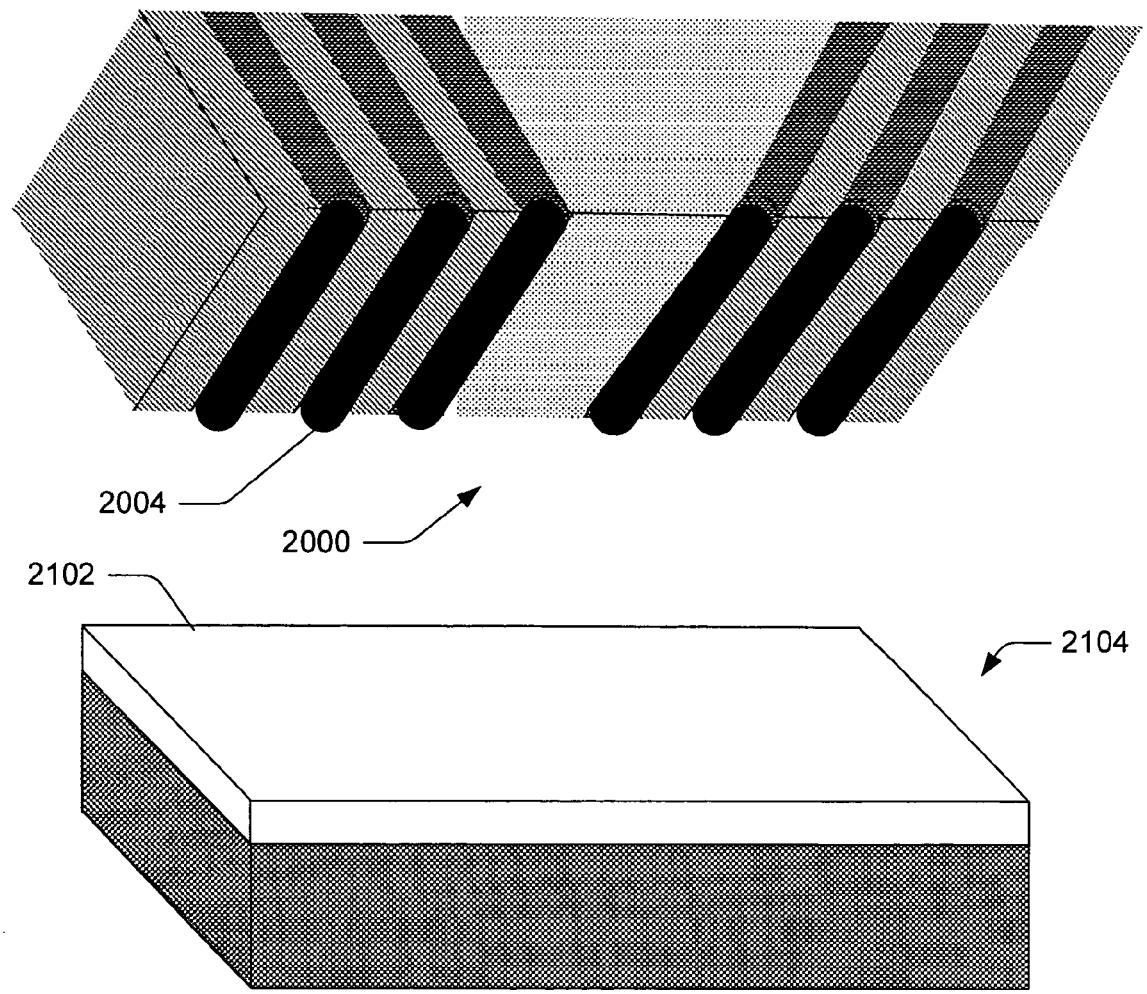
FIG. 21 illustrates an exemplary array of wires on a superlattice and an array substrate.

FIG. 21 sets forth examples of the superlattice 1600, part of the array 2000 of the wires 2004, an adhesion layer 2102, and an array substrate 2104. The adhesion layer 2102 facilitates transfer of the wires 2004 from the superlattice 1600 to the array substrate 2104. The adhesion layer 2102 acts with an adhesion force greater than the adhesion force between the wires 2004 and the superlattice 1600. The platform 100 contacts the wires 2004 to the adhesion layer 2102 and then removes the superlattice 1600 to transfer the wires 2004.

In another implementation, the wires 2004 are transferred to the substrate 2104 using corona discharge. In this implementation, a dielectric surface carrying a uniform electric charge (charged by a corona discharge) is placed some distance from the wires 2004. An insulating substrate (such as an insulating example of the array substrate 2104) is between the wires 2004 and the dielectric surface. When the dielectric surface and the wires 2004 are sufficiently close to each other (though separated by the substrate 2104), electrostatic pull on the wires 2004 caused by the charge on the dielectric surface pulls the wires 2004 to the substrate 2104.

Figure 22:
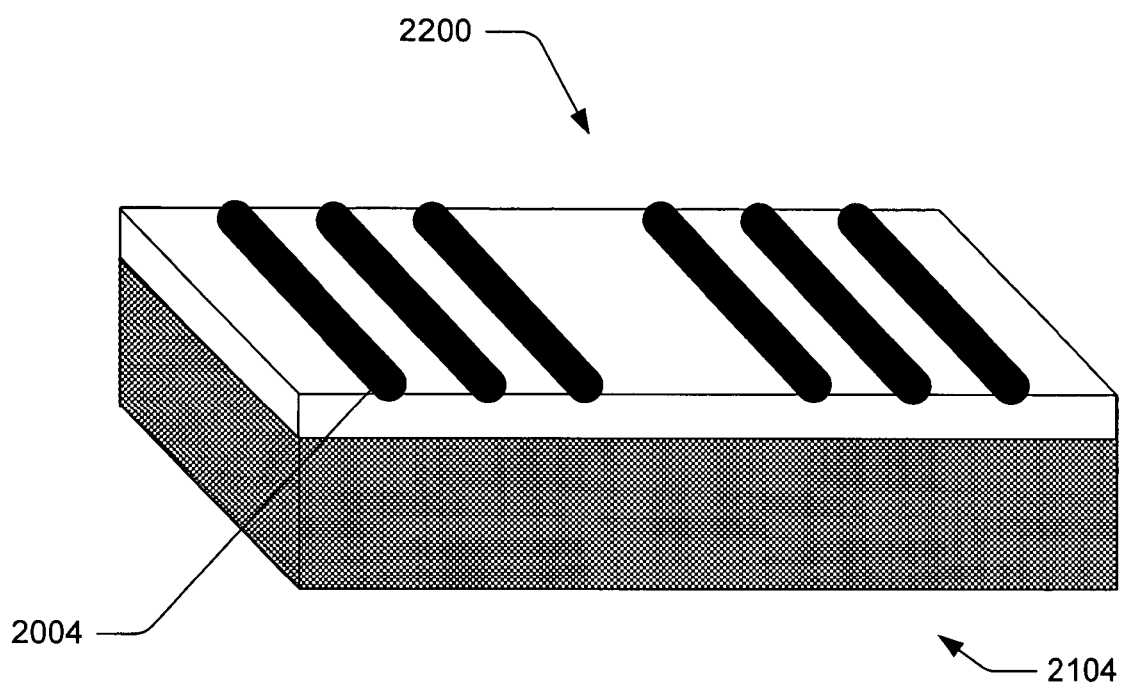
FIG. 22 illustrates an exemplary array of wires on an array substrate.

FIG. 22 sets forth an example of the array substrate 2104 and the wires 2004 after the wires 2004 are transferred. Here the array substrate 2104 includes an exemplary array 2200 of the wires 2004.

Although the invention is described in language specific to structural features and methodological steps, it is to be understood that the invention defined in the appended claims is not necessarily limited to the specific features or steps described. Rather, the specific features and steps disclosed represent preferred forms of implementing the claimed invention.

What is claimed is:

1. A method for forming a superlattice comprising:
   forming a ridge aver a substrate surface, the ridge comprising sidewalk that are disposed substantially acutely relative to the substrate surface;
   applying alternating layers of two or more materials over the ridge; and
   removing part of the ridge and the alternating layers to expose edges of the alternating layers at the sidewalls of the ridge.

2. The method of claim 1, wherein the act of forming the ridge comprises:
   forming a first layer over the substrate surface;
   forming a pattern over the first layer, the pattern having sidewalls disposed substantially acutely relative to the substrate surface; and
   removing the first layer and the pattern sufficient to form the ridge from the first layer.

3. The method of claim 2, wherein the act of removing the first layer and the pattern comprises etching the pattern and the first layer.

4. The method of claim 3, wherein the first layer and the pattern comprise materials with different etch rates.

5. The method of claim 4, wherein the etch rate of the first layer's material is slower than the etch rare of the pattern's material.

6. The method of claim 3, wherein the act of forming the pattern comprises heating the pattern.

7. The method of claim 1, wherein the act of forming the ridge comprises:
forming the ridge with an electron beam.

8. A method comprising:
applying an etchable surface layer over a substrate;
applying a photoresist layer over the etchable surface layer of the substrate;
exposing parts of the photoresist layer to radiation to create a pattern in the photoresist layer;
removing an unpatterened portion of the photoresist layer;
altering a slope of sidewalls of the patterned photoresist layer; and
etching the photoresist layer and the etchable surface layer to remove the photoresist layer and portions of the etchable surface layer, leaving a sloped, patterned ridge of the etchable surface layer, wherein the sloped patterned ridge is geometrically similar to the sloped, patterned photoresist layer;
applying alternating layers of two or more materials, one of the alternating layers having a thickness between one and one hundred nanometers, over the sloped, patterned ridge; and
removing the alternating layers from a top of the sloped, patterned ridge to expose edges of the alternating layers at the sloped sidewalls of the sloped, patterned ridge.

9. The method of claim 8, wherein the act of applying the etchable surface layer comprises applying an oxide layer.

10. The method of claim 8, wherein the act of applying the etchable surface layer comprises applying the etchable surface layer to a thickness from about one-half micron to five microns.

11. The method of claim 8, wherein the etchable surface layer comprises a PECVD oxide or a nitride.

12. The method of claim 8, wherein the etchable surface layer comprises a low-stress TEOS.

13. The method of claim 8, wherein the act of altering the slope of the sidewalls comprises baking the patterned photoresist layer.

14. The method of claim 8, wherein the act of altering the slope of the sidewalls comprises altering the slope to provide sidewalls defining about a thirty to ninety degree angle relative to the substrate.

15. The method of claim 8, wherein the act of altering the slope of the sidewalls is performed until the sidewalls have about a forty-five degree angle from the substrate.

16. The method of claim 8, wherein the act of etching removes the patterned, photoresist layer at a rate about fifty to 150 percent faster than the etchable surface layer.

17. The method of claim 8, wherein the sloped, patterned ridge is non-linear.

18. The method of claim 8 further comprising:
forming an array of wires having a thickness between one and one hundred nanometers over the exposed edges of one of the alternating layers.

19. A method comprising:
applying alternating layers of two or more materials to a thickness between one and one hundred nanometers over a surface of a substrate having one or more non-linear ridges with substantially sloped side walls; and
planarizing the ridges and the alternating layers to expose edges of the alternating layers at the side walls of the ridges.

20. The method of claim 19, wherein the act of applying comprises chemical-vapor depositing of the alternating layers.

21. The method of claim 19, wherein one of the two or more materials is a conductor or semiconductor and another of the two or more materials is an insulator.

22. The method of claim 19, wherein one of the two or more materials is a conductor having oxidation or nitridation rates, and another of the two or more materials is a conductor having different oxidation or nitridation rates.

23. The method of claim 19, wherein one of the two or more materials has a different etch rate than another of the two or more materials.

24. The method of claim 19, further comprising applying another layer of material over the alternating layers and wherein the planarizing stops when the other layer is removed.

25. The method of claim 19, wherein the act of planarizing comprises chemical-mechanically polishing the ridges and alternating layers.

26. The method of claim 19, further comprising forming an array of non-linear wires with a width between one and one hundred nanometers over the exposed edges atone or more of the alternating layers.

27. The method of claim 26, wherein the act of forming comprises:
electrochemically depositing another material over the exposed edges of one or more of the alternating layers.

28. The method of claim 26, wherein the act of forming comprises:
electrophoretically depositing charged objects over the exposed edges of one or more of the alternating layers.

29. The method of claim 26, wherein the act of forming comprises:
charging ions of another material;
charging the exposed edges of one or more of the alternating layers; and
exposing the charged, exposed edges to the charged ions to build the other material up on the charged, exposed edges.

30. The method of claim 29, wherein the other material comprises a polymer, a semiconductor, an oxide, a metal, or biological molecules.

31. The method of claim 19, further comprising:
off-setting the exposed edges of one or more of the alternating layers to create a corrugated cross-section of the exposed edges of the alternating layers; and
stamping a malleable surface of a second substrate with the offset, exposed edges to create a negative of the off-set exposed edges on the malleable surface.

32. The method of claim 31, further comprising forming an array of non-linear wires having a width between one and one hundred nanometers over the negative on the malleable surface.

33. The method of claim 31, wherein the negative comprises an array of non-linear wires.

34. The method of claim 19, wherein one of the materials is a conductor and another of the materials is an insulator, and further comprising:
off-setting the exposed edges of the conductive-material alternating layer from the exposed edges of the insulative-material alternating layer;
charging objects;
charging the off-set, exposed edges of the conductive-material alternating layer;
exposing the charged, off-set exposed edges to the charged objects to electrophoretically collect the objects in the off-set exposed edges.

35. A method comprising:
shaping a surface layer on a substrate into an elongate ridge that extends along a long axis, the ridge being non-linear along the long axis and comprising a transverse cross section with substantially sloped sidewalls and a top;
applying alternating layers of two or more materials to a thickness between one and one hundred nanometers over the ridge; and
removing the alternating layers from the top of the ridge to expose edges of the alternating layers.

36. The method of claim 35, wherein the act of shaping comprises:
applying a photoresist layer over the surface layer of the substrate;
exposing parts of the photoresist layer to radiation to create a non-linear pattern in the photoresist layer;
removing an unpatterned portion of the photoresist layer;
altering a slope of sidewalls of the non-linear, patterned photoresist layer; and
etching the sloped, non-linear, patterned photoresist layer and the surface layer to remove the non-linear, sloped, patterned photoresist layer and portions of the surface layer to create the non-linear ridge with the gene*ally substantially sloped sidewalls.

37. The method of claim 35, wherein the act of shaping comprises:
stamping the surface layer with a negative of the elongate ridge effective to shape the surface layer to comprise the elongate ridge.

38. The method of claim 35, wherein the act of shaping comprises:
applying an electron beam on the surface layer effective to shape the surface layer to comprise the elongate ridge.

39. The method of claim 35, wherein the act of removing comprises:
planarizing the ridge and the alternating layers.

40. The method of claim 35, further comprising:
forming a wire with a width between one and one hundred nanometers on one of the exposed edges of one of the alternating Layers.

41. The method of claim 35, further comprising:
forming an array of non-linear wires over one or more of the exposed edges of one of the alternating layers.

42. A method comprising: applying alternating layers of a first material and a second material over a surface of a substrate having one or mare non-linear ridges with substantially sloped side walls;
planarizing the ridges and the alternating layers to expose first edges of the first material layers and second edges of the second material layers at the side walls of the ridges to form a superlattice:
processing the exposed edges to offset the first edges to corrugate the alternating layers of the first material:
providing the superlattice having an array of co-parallel, curved corrugations between about one and one hundred nanometers wide; and
forming an array of co-parallel, curved wires between about one and one hundred nanometers wide using the array of co-parallel, curved corrugations.

43. The method of claim 42, wherein the act of forming comprises depositing a material over the array of co-parallel, curved corrugations and further comprising transferring the array of curved wires onto a substrate.

44. The method of claim 42, wherein the act of providing comprises providing the superlattice having the array of co-parallel, curved corrugations with at least one pitch of the co-parallel, curved corrugations being between about one and one hundred nanometers.

45. The method of claim 42, wherein the act of providing comprises providing the superlattice with the co-parallel, curved corrugations having an elongate dimension between 1000 nanometers and 10 centimeters.

46. The method of claim 42, wherein the act of forming comprises forming the array of co-parallel, curved wires having a pitch between about one and one hundred nanometers.

47. The method of claim 42, wherein the act of providing comprises providing the superlattice having a second array of co-parallel, curved corrugations and the act of forming comprises forming a second array of co-parallel, curved wires.

48. The method of claim 47, wherein the act of forming the first array of wires and the second array of wires comprises forming the first array non-parallel with the second array.

49. The method of claim 47, wherein the act of forming the first array of wires and the second array of wires comprises forming the first array co-parallel with the second array.

* * * * *

UNITED STATES PATENT AND TRADEMARK OFFICE
CERTIFICATE OF CORRECTION

PATENT NO.        : 7,407,738 B2
APPLICATION NO.   : 10/817729
DATED             : August 5, 2008
INVENTOR(S)       : Pavel Kornilovich et al.

It is certified that error appears in the above-identified patent and that said Letters Patent is hereby corrected as shown below:

On page 2, item (56), under "Other Publications", in column 2, lines 8-11, delete "Melosh, et al.; Ultrahigh-Density Nanowire Lattices and Circuits, California Nanosystems Institute, University of California, Sciencexpress Report, Sciencexpress/www.sciencexpress.org/13March2003/10.1126/science. 1081940, pp. 1-4.". (repeated entry)

In column 12, line 42, in Claim 1, delete "aver" and insert -- over --, therefor.

In column 12, line 43, in Claim 1, delete "sidewalk" and insert -- sidewalls --, therefor.

In column 12, line 64, in Claim 5, delete "rare" and insert -- rate --, therefor.

In column 14, line 20, in Claim 26, delete "atone" and insert -- of one --, therefor.

In column 14, line 47, in Claim 31, delete "offset" and insert -- off-set --, therefor.

In column 14, line 47, in Claim 31, after "the off-set" insert -- , --.

In column 15, line 23, in Claim 36, after "with the" delete "gene*ally".

In column 15, line 40, in Claim 40, delete "Layers" and insert -- layers --, therefor.

In column 16, line 3, in Claim 42, delete "mare" and insert -- more --, therefor.

UNITED STATES PATENT AND TRADEMARK OFFICE
CERTIFICATE OF CORRECTION

PATENT NO. : 7,407,738 B2
APPLICATION NO. : 10/817729
DATED : August 5, 2008
INVENTOR(S) : Pavel Kornilovich et al.

It is certified that error appears in the above-identified patent and that said Letters Patent is hereby corrected as shown below:

In column 16, line 8, in Claim 42, delete "superlattice:" and insert -- superlattice; --, therefor.

In column 16, line 10, in Claim 42, delete "material:" and insert -- material; --, therefor.

Signed and Sealed this

Twenty-fifth Day of November, 2008

JON W. DUDAS
*Director of the United States Patent and Trademark Office*